US012813322B2

(12) United States Patent
Takeoka

(10) Patent No.: US 12,813,322 B2
(45) Date of Patent: Nov. 24, 2026

(54) SEMICONDUCTOR DEVICE AND SEMICONDUCTOR PACKAGE INCLUDING SAME

(71) Applicant: ROHM CO., LTD., Kyoto (JP)

(72) Inventor: Reona Takeoka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 380 days.

(21) Appl. No.: 18/391,351

(22) Filed: Dec. 20, 2023

(65) Prior Publication Data

US 2024/0213200 A1 Jun. 27, 2024

(30) Foreign Application Priority Data

Dec. 22, 2022 (JP) ................................ 2022-205692

(51) Int. Cl.

*H10W 74/10* (2026.01)
*H10W 72/20* (2026.01)
*H10W 72/90* (2026.01)
*H10W 72/29* (2026.01)
*H10W 90/00* (2026.01)

(52) U.S. Cl.

CPC ........ *H10W 74/114* (2026.01); *H10W 72/234* (2026.01); *H10W 72/252* (2026.01); *H10W 72/29* (2026.01); *H10W 72/922* (2026.01); *H10W 90/726* (2026.01)

(58) Field of Classification Search

CPC . H10W 74/114; H10W 72/012; H10W 72/20; H10W 72/019; H10W 72/072; H10W 72/90

See application file for complete search history.

(56) References Cited

U.S. PATENT DOCUMENTS 6,959,856 B2 * 11/2005 Oh .......................... H10P 14/47 257/E23.021
8,084,760 B2 * 12/2011 Lung .................. H10N 70/8833 438/102
2004/0072387 A1 * 4/2004 Hong .................. H10W 72/012 257/E23.021
2006/0223313 A1 * 10/2006 Yoon ................... H10W 72/012 257/E23.021
2006/0278984 A1 * 12/2006 Yamada ................ H10W 72/20 257/737
2008/0157362 A1 * 7/2008 Chang .................. H10W 72/20 257/E23.021

(Continued)

FOREIGN PATENT DOCUMENTS

JP 2020167330 A 10/2020

*Primary Examiner* — Mohsen Ahmadi
(74) *Attorney, Agent, or Firm* — Rabin & Berdo, P.C.

(57) ABSTRACT

A semiconductor device includes: a semiconductor device main body; and an electrode terminal provided at a side of a main surface of the semiconductor device main body and partially protruding outward from the main surface, wherein the electrode terminal includes: a pillar layer made of copper and electrically connected to a wiring layer disposed within the semiconductor device main body; and a bonding layer formed over a surface of the pillar layer on an opposite side of the pillar layer from the wiring layer, and wherein the pillar layer includes: a disc-shaped first portion; and a columnar second portion formed over a central portion of a surface of the first portion on an opposite side of the first portion from the wiring layer.

13 Claims, 25 Drawing Sheets

(56) References Cited

U.S. PATENT DOCUMENTS

| | | | | |
|---|---|---|---|---|
| 2010/0103634 | A1* | 4/2010 | Funaya | H05K 1/185 174/262 |
| 2011/0062584 | A1* | 3/2011 | Ishihara | H10P 72/74 257/737 |
| 2011/0101527 | A1* | 5/2011 | Cheng | H10W 72/012 257/737 |
| 2011/0193219 | A1* | 8/2011 | Lai | H10W 72/0198 257/E23.06 |
| 2011/0221069 | A1* | 9/2011 | Kunimoto | H10W 70/09 257/774 |
| 2011/0260317 | A1* | 10/2011 | Lu | H10W 72/012 257/E23.079 |
| 2012/0086124 | A1* | 4/2012 | Yamaguchi | H10W 20/47 257/E23.021 |
| 2012/0248605 | A1* | 10/2012 | Yamaguchi | H10W 72/019 257/737 |
| 2013/0093100 | A1* | 4/2013 | Shariff | H10W 20/023 257/E21.597 |
| 2014/0070396 | A1* | 3/2014 | Kyozuka | H10W 70/09 257/698 |
| 2015/0305153 | A1* | 10/2015 | Imafuji | H05K 3/4007 174/261 |
| 2016/0027747 | A1* | 1/2016 | Ryu | H10W 74/137 257/737 |
| 2016/0322321 | A1* | 11/2016 | Yajima | H10W 74/012 |
| 2016/0322322 | A1* | 11/2016 | Utsunomiya | H10W 72/012 |
| 2020/0258855 | A1* | 8/2020 | Marbella | H10W 72/012 |
| 2020/0365505 | A1* | 11/2020 | Zhang | H10W 70/092 |
| 2021/0217719 | A1* | 7/2021 | Kono | H05K 3/00 |
| 2022/0254692 | A1* | 8/2022 | Koga | H10P 74/27 |

* cited by examiner

SEMICONDUCTOR DEVICE AND SEMICONDUCTOR PACKAGE INCLUDING SAME

CROSS-REFERENCE TO RELATED APPLICATION

This application is based upon and claims the benefit of priority from Japanese Patent Application No. 2022-205692, filed on Dec. 22, 2022, the entire contents of which are incorporated herein by reference.

TECHNICAL FIELD

The present disclosure relates to a semiconductor device and a semiconductor package including the same.

BACKGROUND

In the related art, there is disclosed a semiconductor device including an element main body, a plurality of electrode terminals (electrodes), and a surface protection film.

Each of the electrode terminals includes a Cu electrode layer electrically connected to a wiring layer, a pad electrode layer formed on the Cu electrode layer, a seed layer formed on the pad electrode layer, a Cu columnar body formed on the seed layer, and a bonding layer formed on the Cu columnar body.

The Cu electrode layer consists of a Cu layer. The pad electrode layer consists of a laminated film of a Ni layer at a side of the Cu electrode layer and a Pd layer formed on the Ni layer. The bonding layer consists of a nickel layer at a side of the Cu columnar body and a solder layer formed on the nickel layer.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described in detail with reference to the accompanying drawings.

Figure 1:
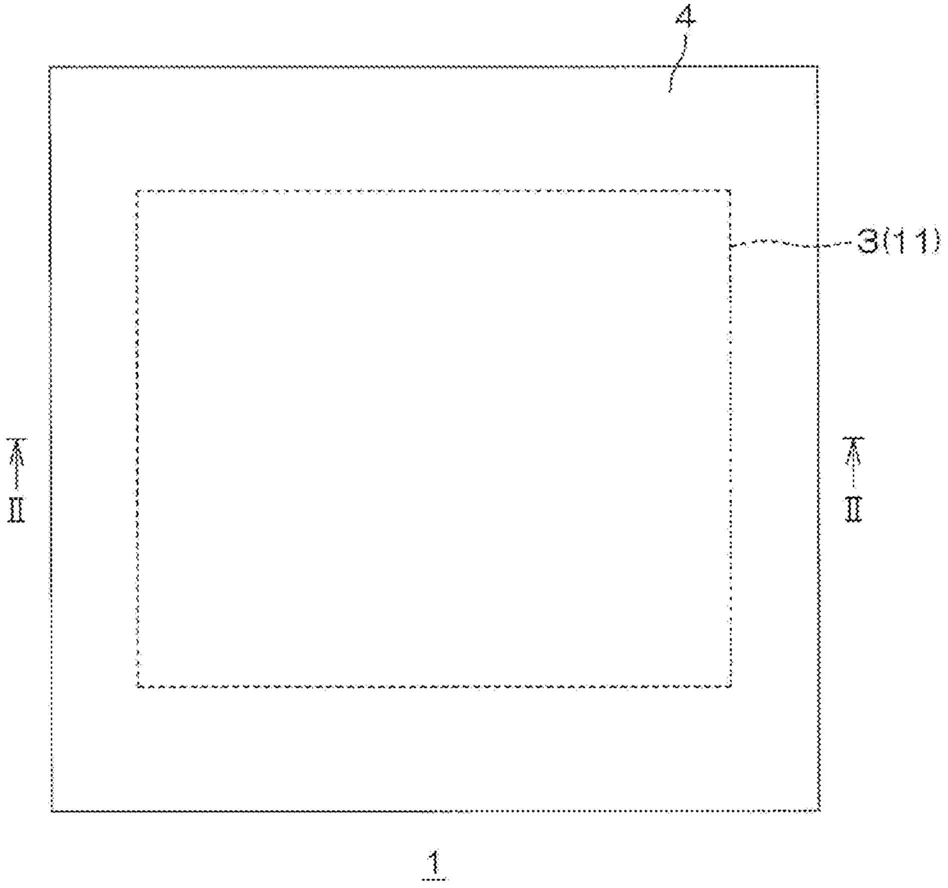
FIG. 1 is a schematic plan view showing a semiconductor package including a semiconductor device according to a first embodiment of the present disclosure.
Figure 2:
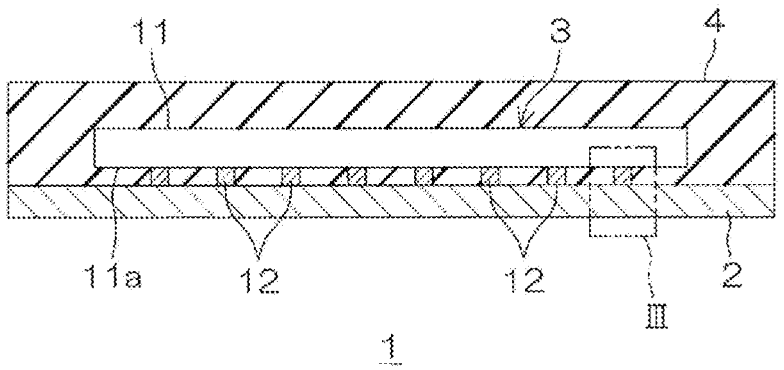
FIG. 2 is a schematic cross-sectional view taken along line II-II in FIG. 1.
Figure 3:
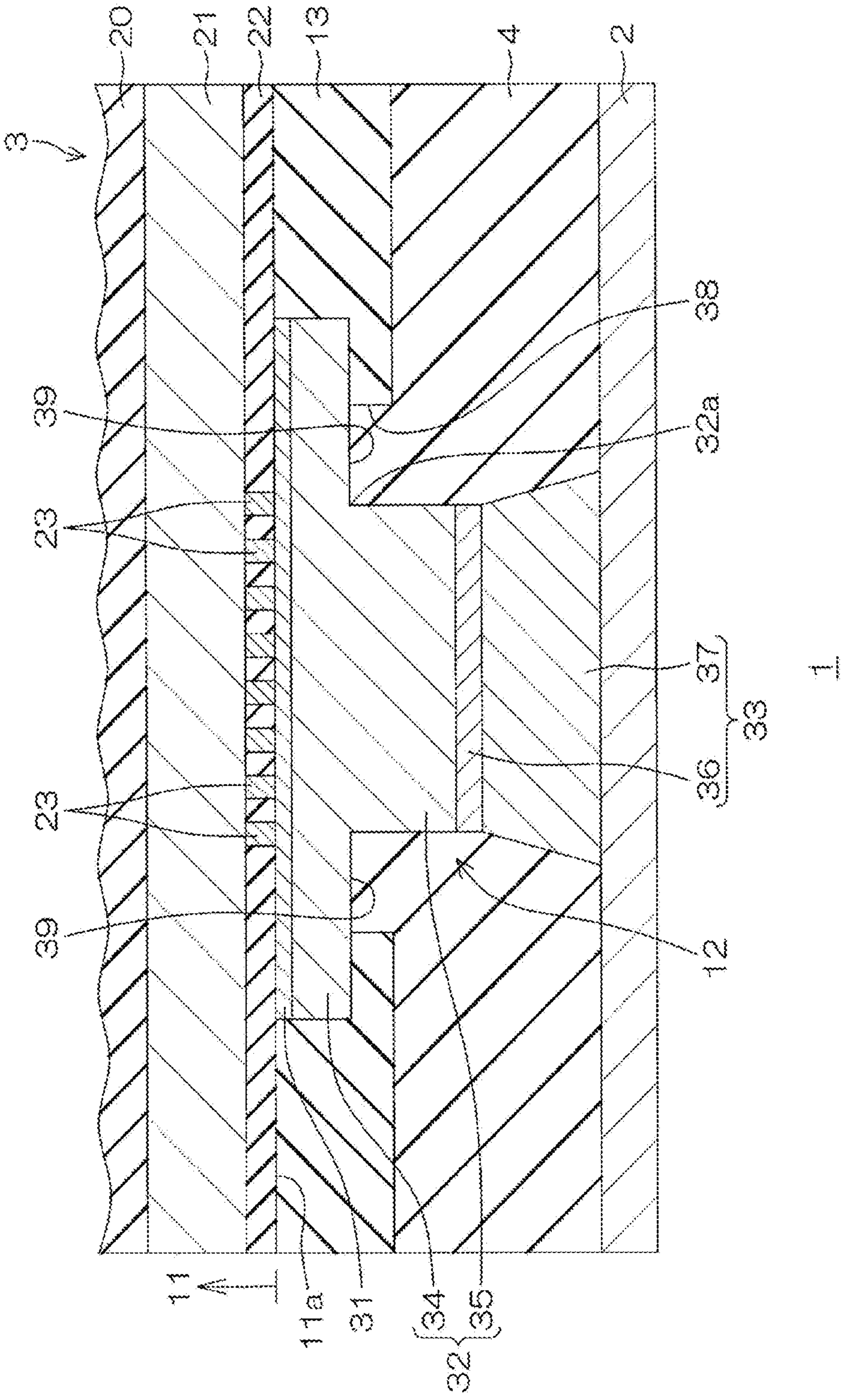
FIG. 3 is an enlarged cross-sectional view of a region indicated by III in FIG. 2.
Figure 4:
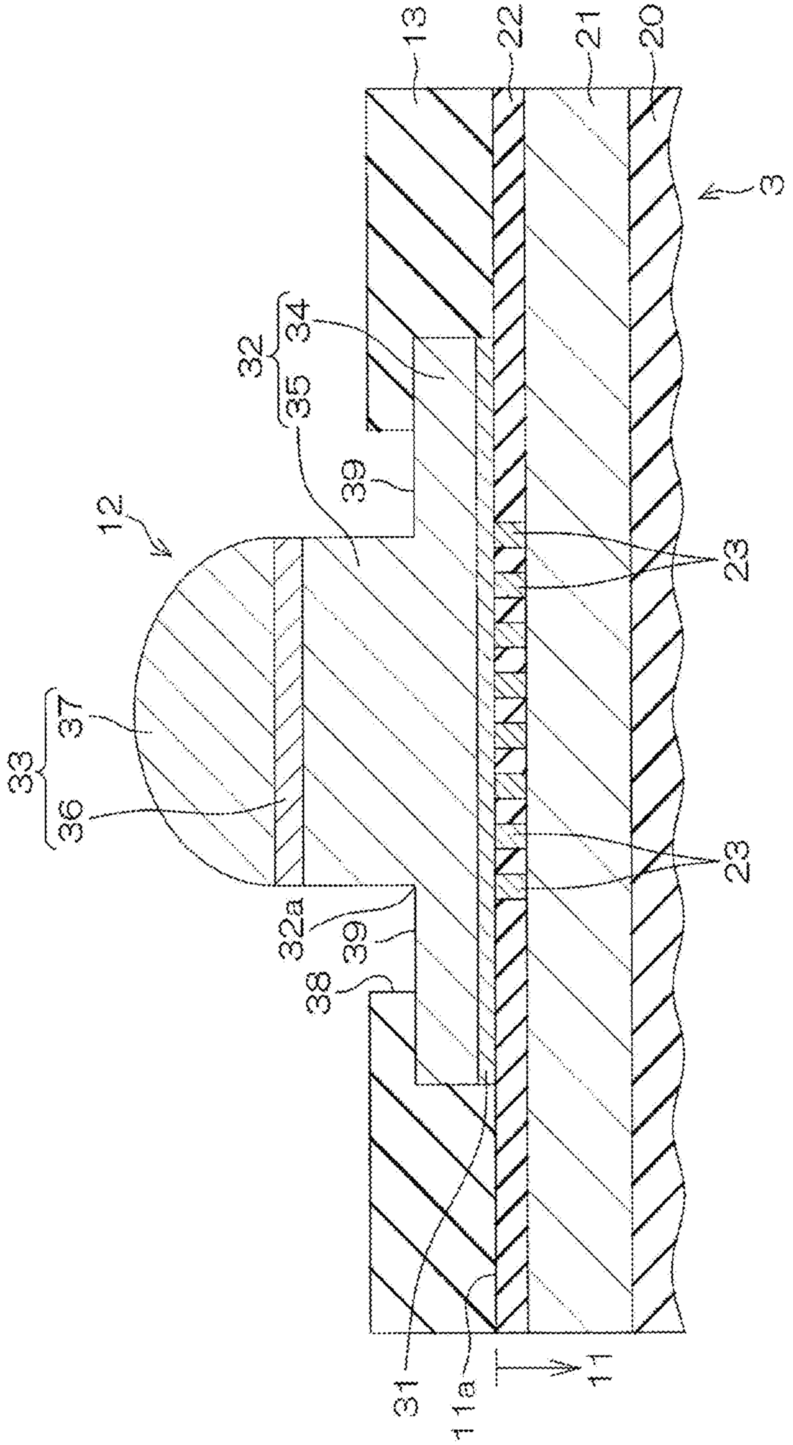
FIG. 4 is a cross-sectional view mainly showing a configuration of an electrode terminal of the semiconductor device according to the first embodiment of the present disclosure.

FIG. 1 is a schematic plan view showing a semiconductor package including a semiconductor device according to a first embodiment of the present disclosure. FIG. 2 is a schematic cross-sectional view taken along line II-II in FIG. 1. FIG. 3 is an enlarged cross-sectional view of a region indicated by III in FIG. 2. FIG. 4 is a cross-sectional view mainly showing a configuration of an electrode terminal of the semiconductor device according to the first embodiment of the present disclosure.

However, FIG. 4 shows the configuration of the electrode terminal before being bonded to a lead. Further, FIG. 3 shows a state in which a main surface 11*a* of a semiconductor device main body 11 faces downward, whereas FIG. 4 shows a state in which the main surface 11*a* of the semiconductor device main body 11 faces upward.

Referring to FIGS. 1 and 2, the semiconductor package 1 has a flat rectangular parallelepiped shape. The semiconductor package 1 contains a plurality of leads 2, a semiconductor device 3 electrically connected to the plurality of leads 2, and a sealing resin 4 that seals a portion of each lead 2 and the semiconductor device 3. In FIG. 2, only one of the plurality of leads 2 is shown.

The semiconductor device 3 includes the semiconductor device main body 11 having the main surface 11*a* facing the lead 2, a plurality of electrode terminals 12 provided at the main surface 11*a* of the semiconductor device main body 11 and protruding outward from the main surface 11*a*, and a surface protection film 13 (see FIGS. 3 and 4). In FIG. 2, the surface protection film 13 is omitted.

In the following description, the upper side in FIG. 4 (the lower side in FIG. 3) is referred to as "top," and the lower side in FIG. 4 (the upper side in FIG. 3) is referred to as "bottom."

Referring to FIGS. 3 and 4, the semiconductor device main body 11 includes a semiconductor substrate (not shown), a semiconductor layer (not shown) formed over the semiconductor substrate, elements (not shown) such as a switching element formed over the semiconductor layer, and an interlayer insulating film 20 formed over the semiconductor layer.

The semiconductor device main body 11 further includes a wiring layer 21 formed over the interlayer insulating film 20, an insulating layer 22 formed over the interlayer insulating film 20 so as to cover the wiring layer 21, and a plurality of vias 23 that penetrate the insulating layer 22 and whose one ends are electrically connected to the wiring layer 21. The wiring layer 21 may be an electrode of an element formed at the semiconductor layer. Although not shown, the wiring layer 21 may be electrically connected to, for example, the element formed at the semiconductor layer. In this embodiment, a surface (top surface) of the insulating layer 22 on an opposite side of the insulating layer 22 from the wiring layer 21 constitutes the main surface 11*a* of the semiconductor device main body 11.

Each electrode terminal 12 includes a seed layer 31 that is formed over the surface (top surface) of the insulating layer 22 on the opposite side of the insulating layer 22 from the wiring layer 21 and to which the other ends of the plurality of vias 23 are electrically connected. The electrode terminal 12 further includes a pillar layer 32 formed over a surface (top surface) of the seed layer 31 on an opposite side of the seed layer 31 from the insulating layer 22, and a bonding layer 33 formed over a surface (top surface) of the pillar layer 32 on an opposite side of the pillar layer 32 from the seed layer 31.

The seed layer 31 is electrically connected to the wiring layer 21 through the plurality of vias 23. The pillar layer 32 is electrically connected to the seed layer 31. The bonding layer 33 is electrically connected to the pillar layer 32.

In this embodiment, the seed layer 31 includes a laminated film of a Ni layer formed over the top surface of the insulating layer 22 and a Pd layer formed over the Ni layer.

The pillar layer 32 includes a Cu layer. The pillar layer 32 includes a disc-shaped first portion 34 formed over the top surface of the seed layer 31 and a columnar second portion 35 formed over a central portion of a surface (top surface) of the first portion 34 on an opposite side of the first portion 34 from the seed layer 31. In a plan view, a center of the second portion 35 coincides with a center of the first portion 34. A diameter of the first portion 34 is larger than a diameter of the second portion 35. The first portion 34 and the second portion 35 are integrally formed.

The diameter of the first portion 34 is preferably 80 μm or more and 400 μm or less. A thickness of the first portion 34 is preferably 4 μm or more and 15 μm or less.

The diameter of the second portion 35 is preferably 40 μm or more and 300 μm or less. A thickness of the second portion 35 is preferably 35 μm or more and 150 μm or less.

At a connection portion where the top surface of the first portion 34 and a side surface of the second portion 35 are connected, the top surface of the first portion 34 and the side surface of the second portion 35 intersect at a substantially right angle in a vertical cross-sectional view. That is, the pillar layer 32 has a corner portion 32*a* where the top surface of the first portion 34 and the side surface of the second portion 35 intersect at a substantially right angle.

In this embodiment, the bonding layer 33 includes a barrier layer 36 formed over a surface (top surface) of the second portion 35 of the pillar layer 32 on an opposite side of the second portion 35 from the first portion 34, and a solder layer 37 formed over a surface (top surface) of the barrier layer 36 on an opposite side of the barrier layer 36 from the pillar layer 32. The barrier layer 36 is disc-shaped and concentric with the second portion 35. In this embodiment, a diameter of the barrier layer 36 is approximately equal to the diameter of the second portion 35. Therefore, in this embodiment, a side surface of the barrier layer 36 and the side surface of the second portion 35 are flush with each other. In this embodiment, the barrier layer 36 includes a Ni layer. A thickness of the barrier layer 36 is preferably 2 μm or more and 20 μm or less.

In this embodiment, the solder layer 37 includes a SnAg layer. As shown in FIG. 4, before the electrode terminal 12 is bonded to the lead 2, a surface of the solder layer 37 is formed in a hemispherical shape.

The surface protection film 13 covers an exposed surface of the insulating layer 22, a side surface of the first portion 34, and an outer peripheral edge portion of the top surface of the first portion 34. A peripheral edge portion of the second portion 35 at the top surface of the first portion 34, the side surface of the second portion 35, and a surface of the bonding layer 33 are not covered by the surface protection film 13.

In other words, the surface protection film 13 is formed with a circle-shaped removed portion (opening) 38 that is concentric with a center of the second portion 35 and is larger than an outer peripheral edge of the second portion 35 and smaller than an outer peripheral edge of the first portion, in a plan view. A side surface (inner peripheral surface) of the removed portion 38, the side surface of the second portion 35, and a portion between the side surface of the removed portion 38 and the side surface of the second portion 35 at the top surface of the first portion 34 form an annular recess 39 in a plan view. In this embodiment, the surface protection film 13 is made of photosensitive resin, such as polyimide.

When the electrode terminal 12 is bonded to the lead 2, a tip of the solder layer 37 is bonded to the lead 2 in a molten state. Therefore, when the electrode terminal 12 is bonded to the lead 2, the tip of the solder layer 37 is formed into a flat surface, as shown in FIG. 3. After the electrode terminal 12 is bonded to the lead 2, sealing with the sealing resin 4 is performed. In a state where the sealing with the sealing resin 4 is performed, a gap between the surface protection film 13 and the lead 2 and a space inside the recess 39 are filled with the sealing resin 4, as shown in FIG. 3.

FIGS. 5A to 5H are cross-sectional views, corresponding to a cut plane of FIG. 4, showing an example of a process of forming the electrode terminal 12 shown in FIG. 4.

Figure 5A:
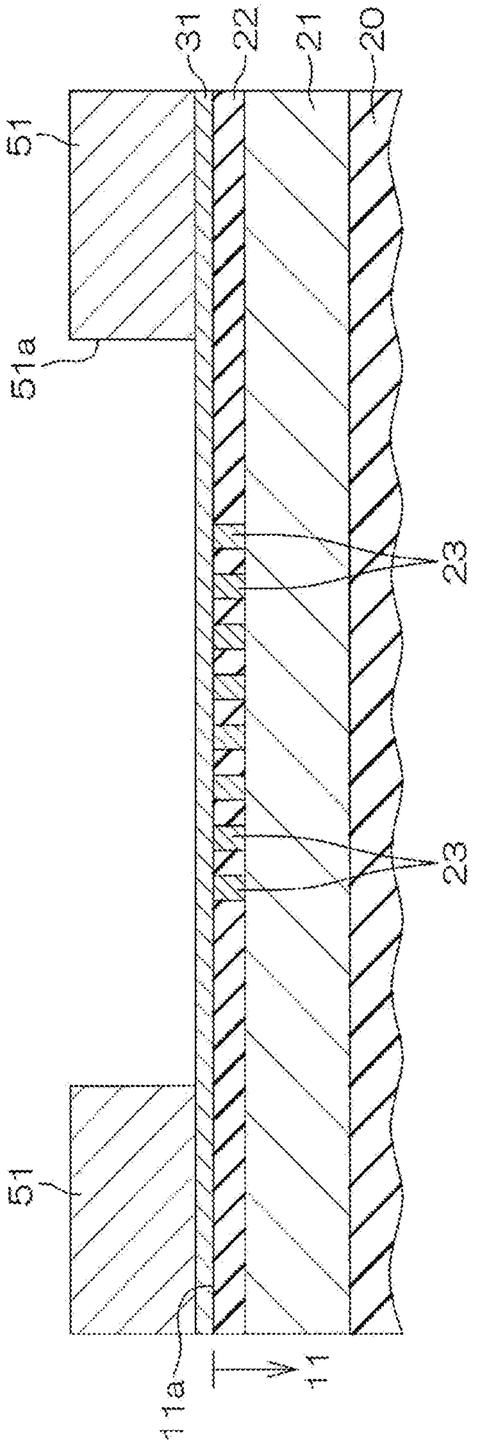
FIG. 5A is a cross-sectional view, corresponding to a cut plane of FIG. 4, showing a part of a process of forming the electrode terminal shown in FIG. 4.

As shown in FIG. 5A, first, the seed layer 31 is formed over the top surface of the insulating layer 22. Thereafter, a resist mask 51 including an opening 51*a* in a region where the first portion 34 of the pillar layer 32 is to be formed is formed on the top surface of the seed layer 31 by photolithography.

Figure 5B:
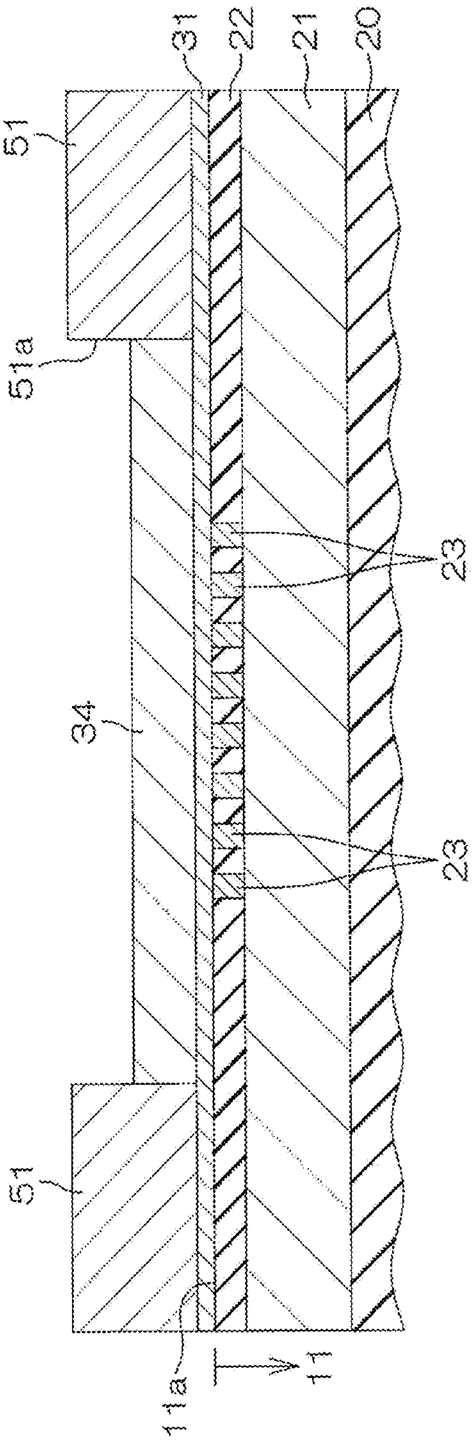
FIG. 5B is a cross-sectional view showing a next step of FIG. 5A.

Next, as shown in FIG. 5B, the first portion 34 of the pillar layer 32 is formed over the top surface of the seed layer 31 by a plating method. Thereafter, the resist mask 51 is removed.

Figure 5C:
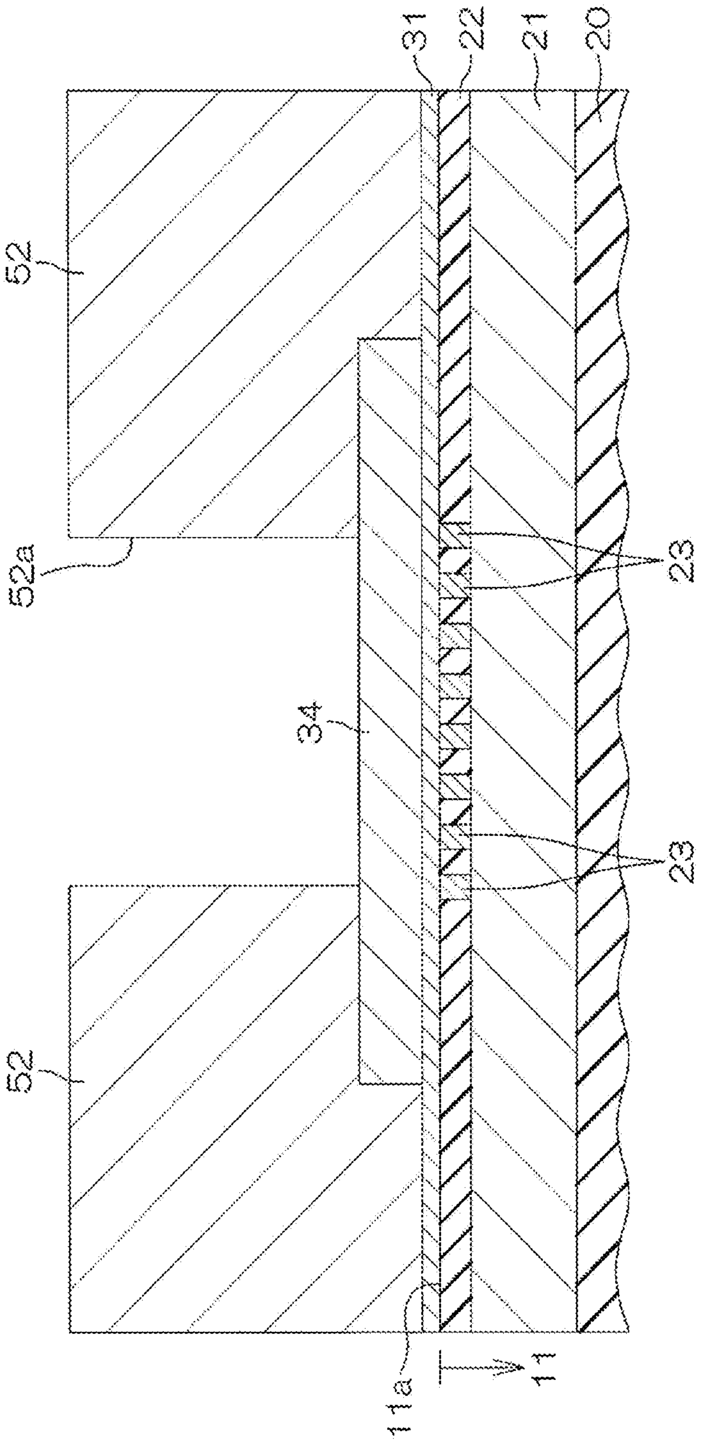
FIG. 5C is a cross-sectional view showing a next step of FIG. 5B.

Next, as shown in FIG. 5C, a resist mask 52 including an opening 52*a* in a region where the second portion 35 of the pillar layer 32 is to be formed is formed over the top surfaces of the seed layer 31 and the first portion 34 by photolithography.

Figure 5D:
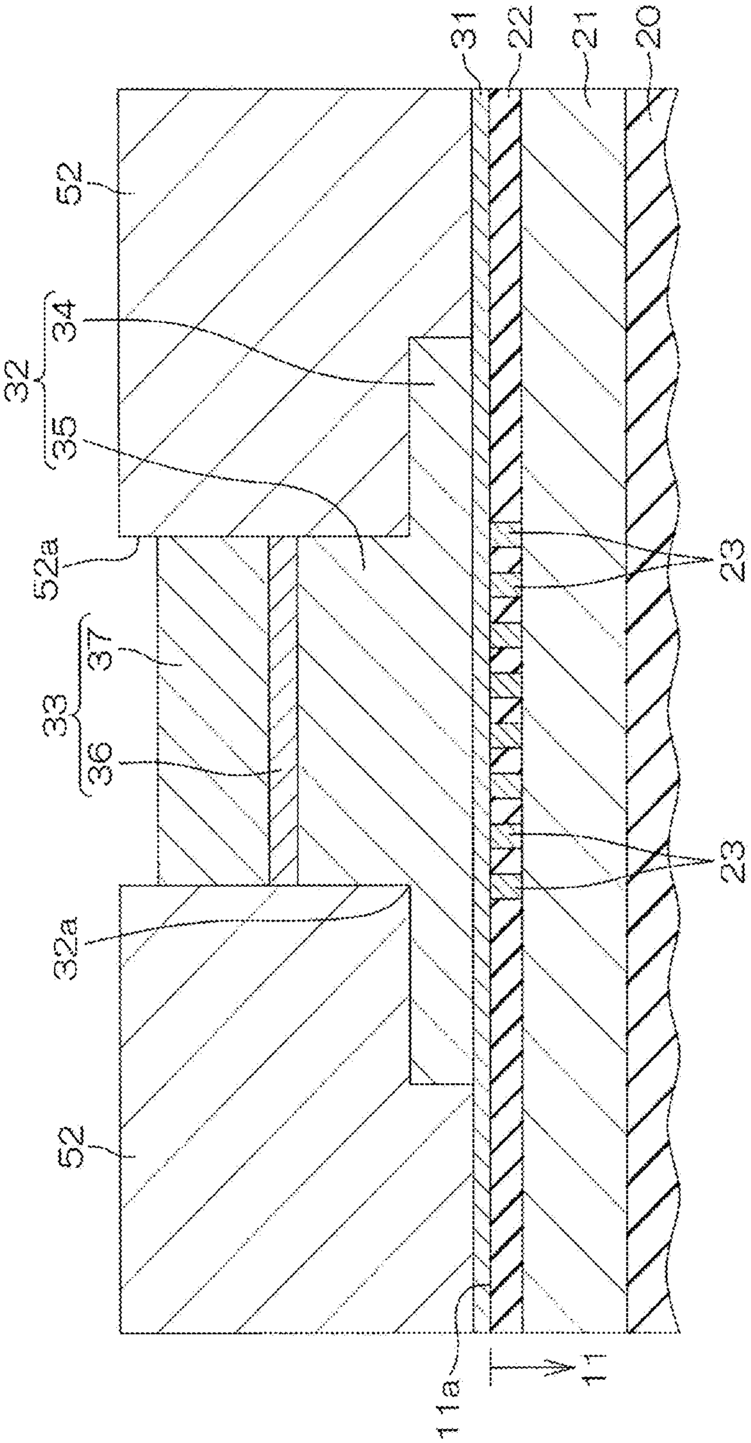
FIG. 5D is a cross-sectional view showing a next step of FIG. 5C.

Next, as shown in FIG. 5D, the second portion 35, the barrier layer 36, and the solder layer 37 are sequentially formed over the first portion 34 by a plating method. As a result, the pillar layer 32 including the first portion 34 and the second portion 35 is formed over the seed layer 31, and the bonding layer 33 including the barrier layer 36 and the solder layer 37 is formed over the pillar layer 32. At this stage, a top surface of the solder layer 37 is a flat surface, and the electrode terminal 12 is not yet completed. Therefore, an electrode terminal, which is in progress being manufactured, including the seed layer 31, the pillar layer 32, and the bonding layer 33 is formed over the insulating layer 22.

Figure 5E:
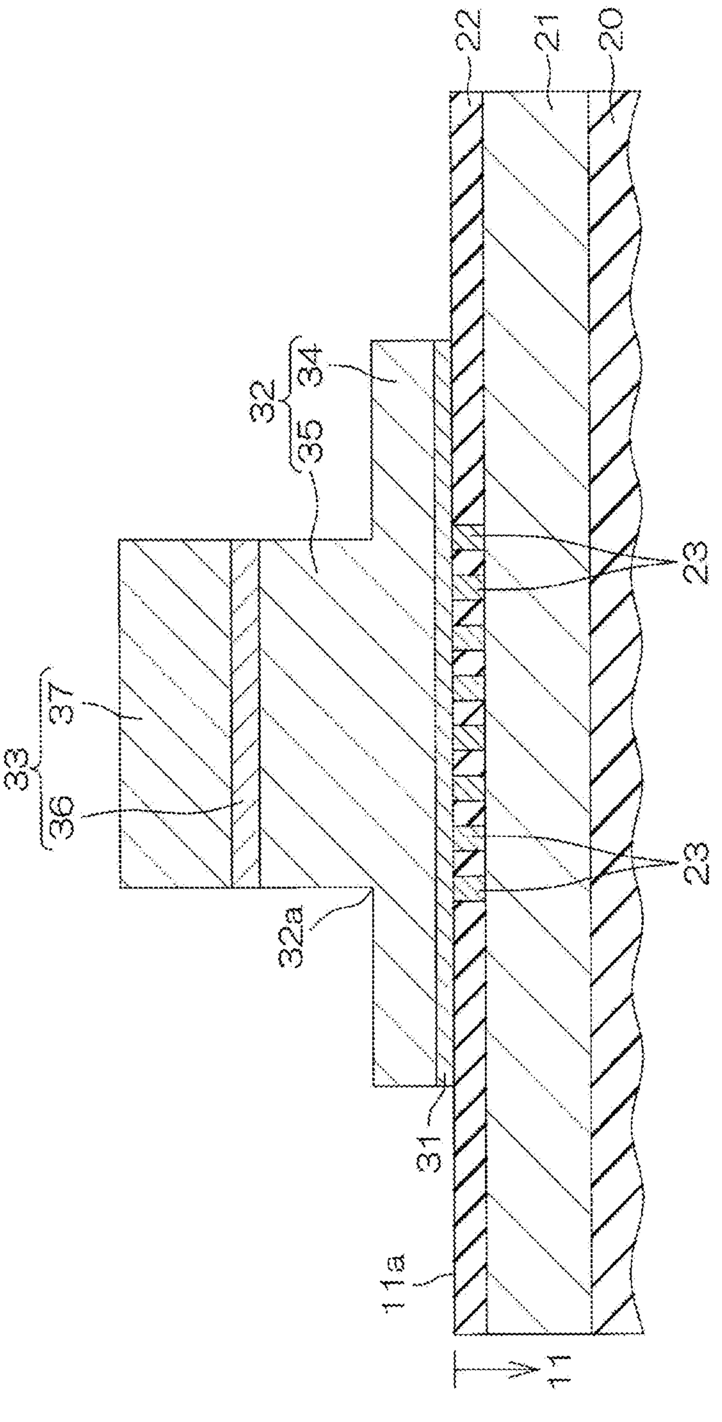
FIG. 5E is a cross-sectional view showing a next step of FIG. 5D.

Next, as shown in FIG. 5E, the resist mask 52 is removed. Then, unnecessary portions of the seed layer 31 are removed by etching so that only the seed layer 31 below the pillar layer 32 remains.

Figure 5F:
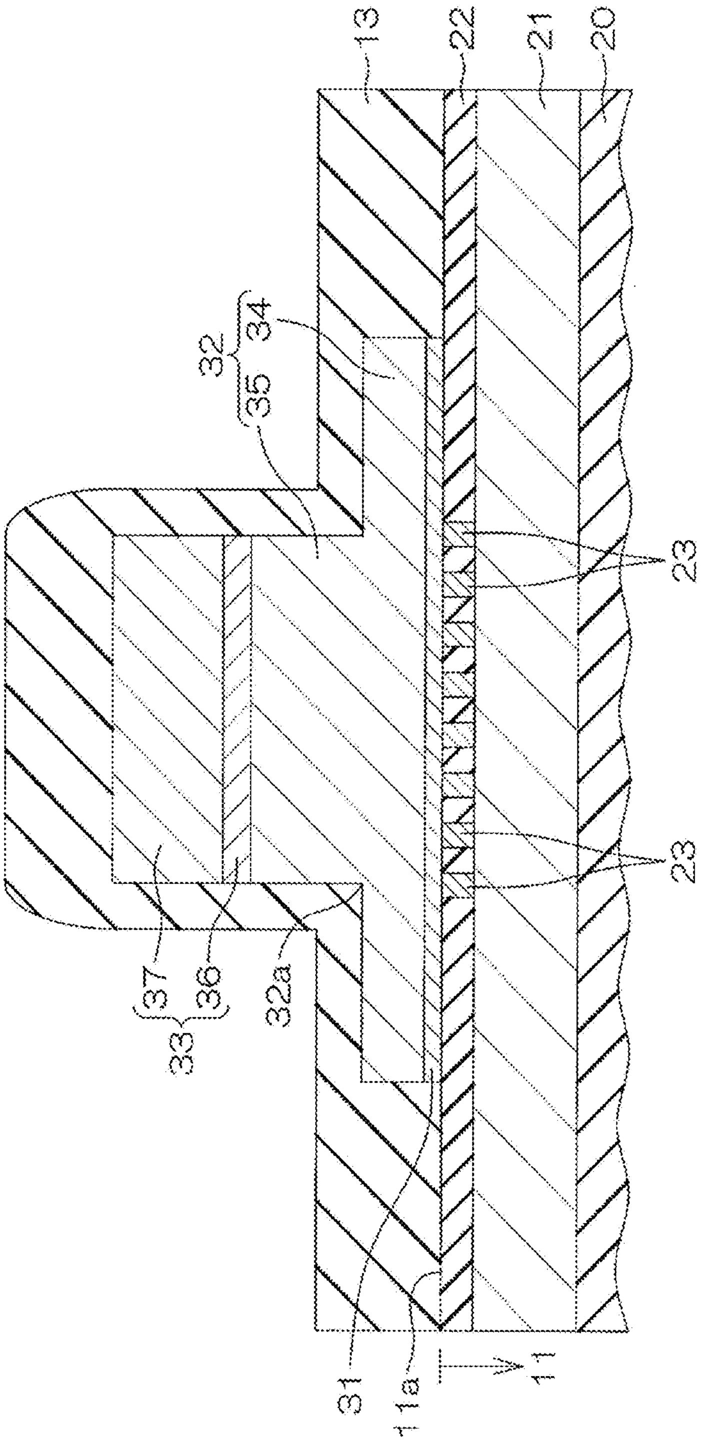
FIG. 5F is a cross-sectional view showing a next step of FIG. 5E.

Next, as shown in FIG. 5F, the surface protection film 13 made of photosensitive resin is formed over the insulating layer 22 so as to cover an exposed surface of the insulating layer 22 and an exposed surface of the electrode terminal, which is in progress being manufactured.

Figure 5G:
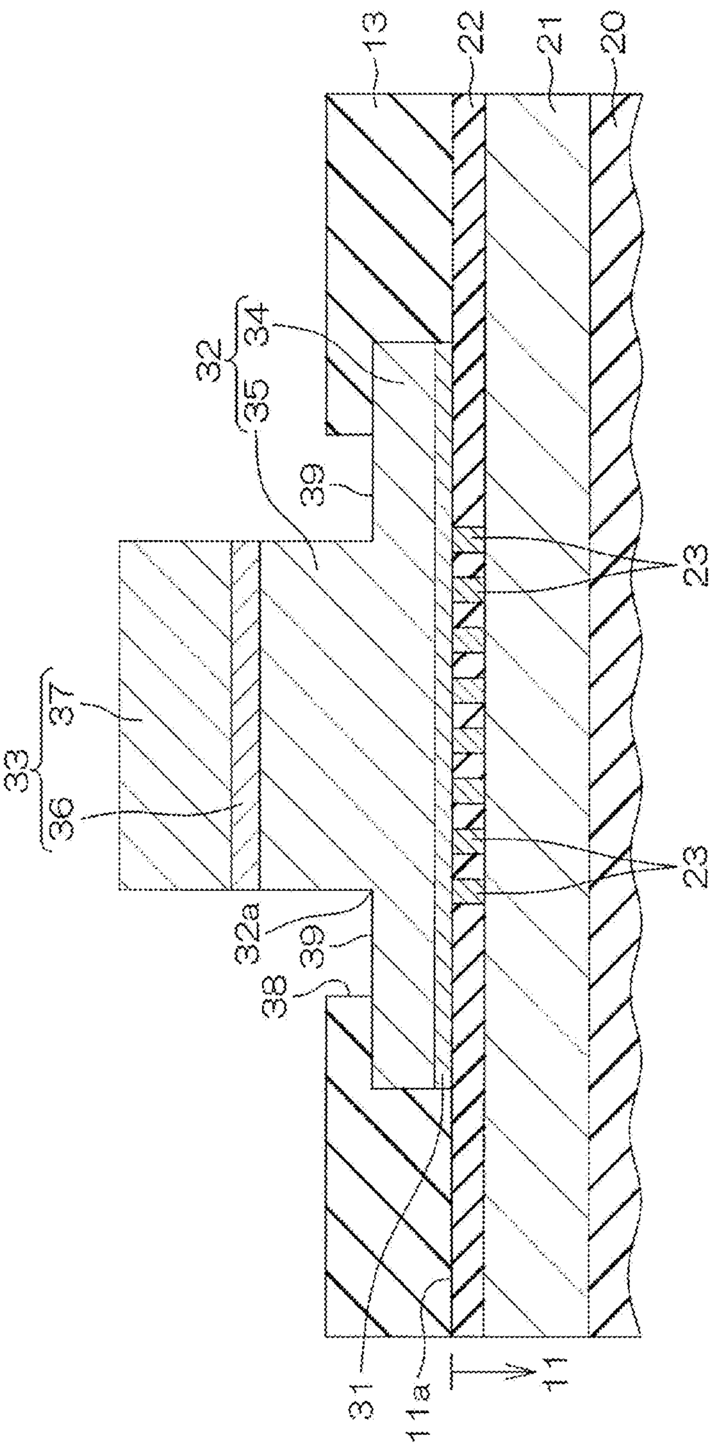
FIG. 5G is a cross-sectional view showing a next step of FIG. 5F.

Next, as shown in FIG. 5G, the surface protection film 13 is patterned by exposing, developing, and curing the surface protection film 13. As a result, the surface protection film 13 covering the peripheral edge portion of the second portion 35 on the top surface of the first portion 34, the side surfaces of the second portion 35, the barrier layer 36, and the solder layer 37, and the top surface of the solder layer 37 is removed. As a result, the removed portion 38 is formed in the surface protection film 13. As a result, the recess 39 is formed.

Figure 5H:
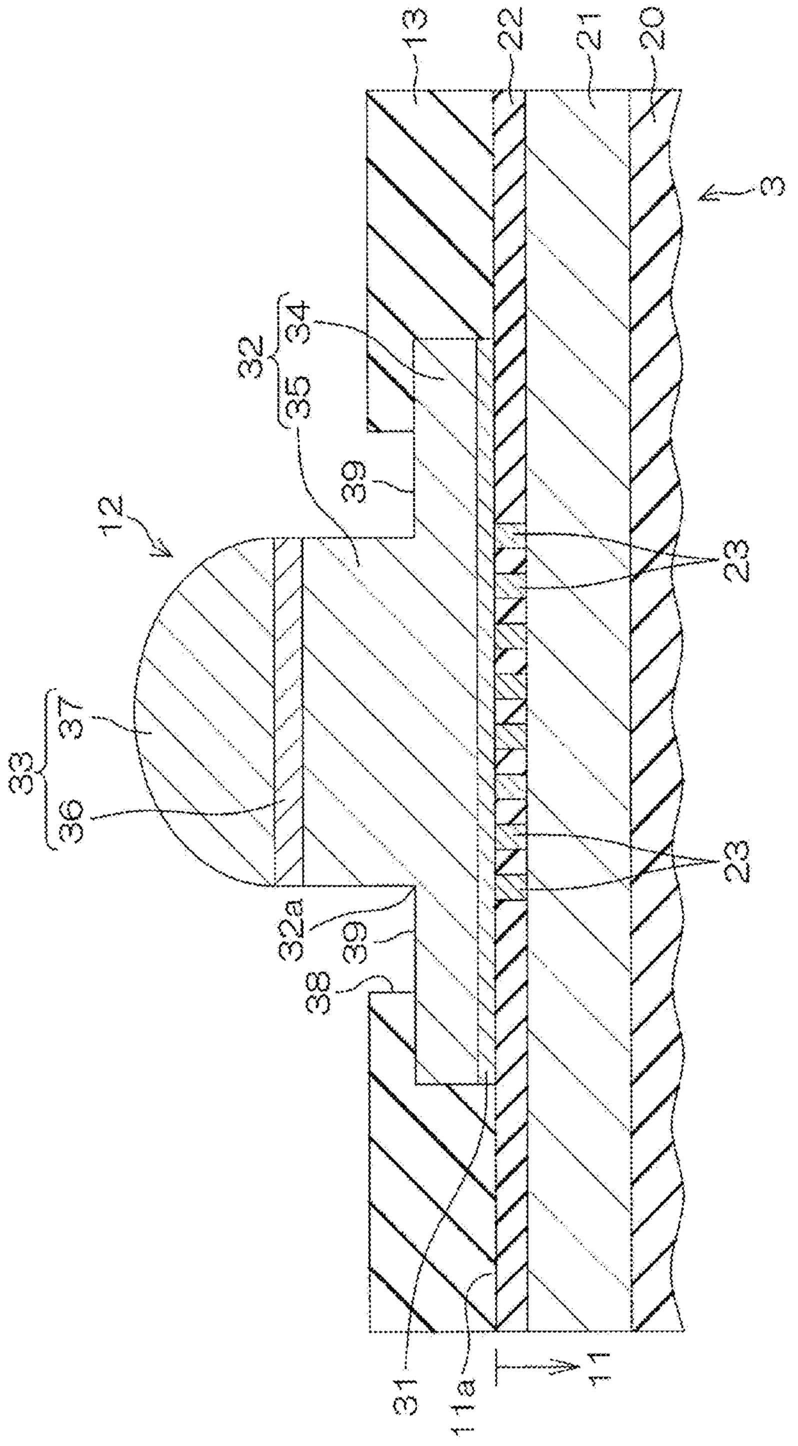
FIG. 5H is a cross-sectional view showing a next step of FIG. 5G.

Next, as shown in FIG. 5H, the surface of the solder layer 37 is formed into a hemispherical shape by reflow. As a result, the electrode terminal 12 shown in FIG. 4 is formed.

Further, the surface of the solder layer 37 may be formed into a spherical shape by reflow after the step of FIG. 5E. In this case, the steps of FIGS. 5F and 5G are then performed. In this case, the step of FIG. 5H is not performed after the step of FIG. 5G.

Figure 6:
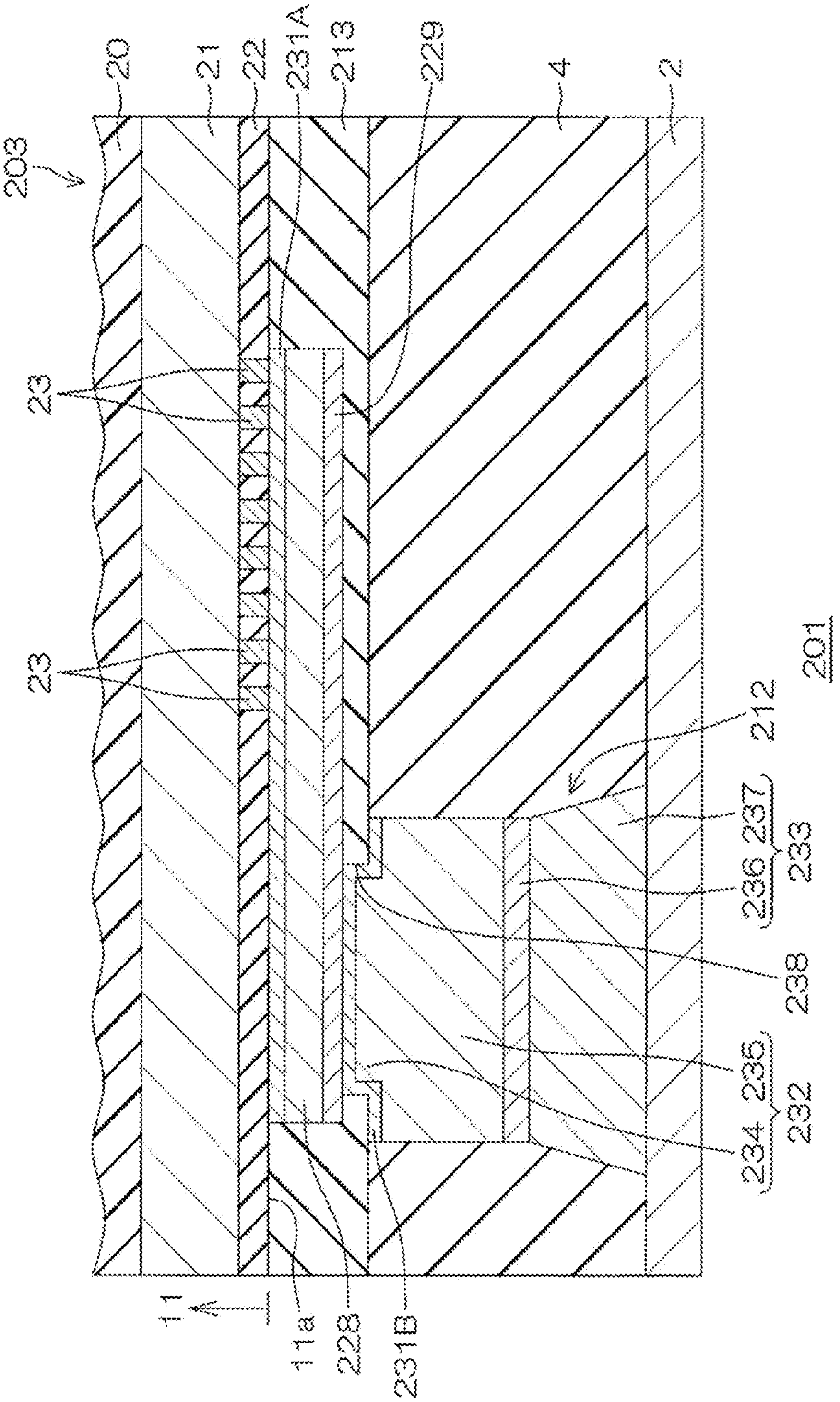
FIG. 6 is a schematic cross-sectional view, corresponding to FIG. 3, showing a semiconductor package including a semiconductor device according to a comparative example.
Figure 7:
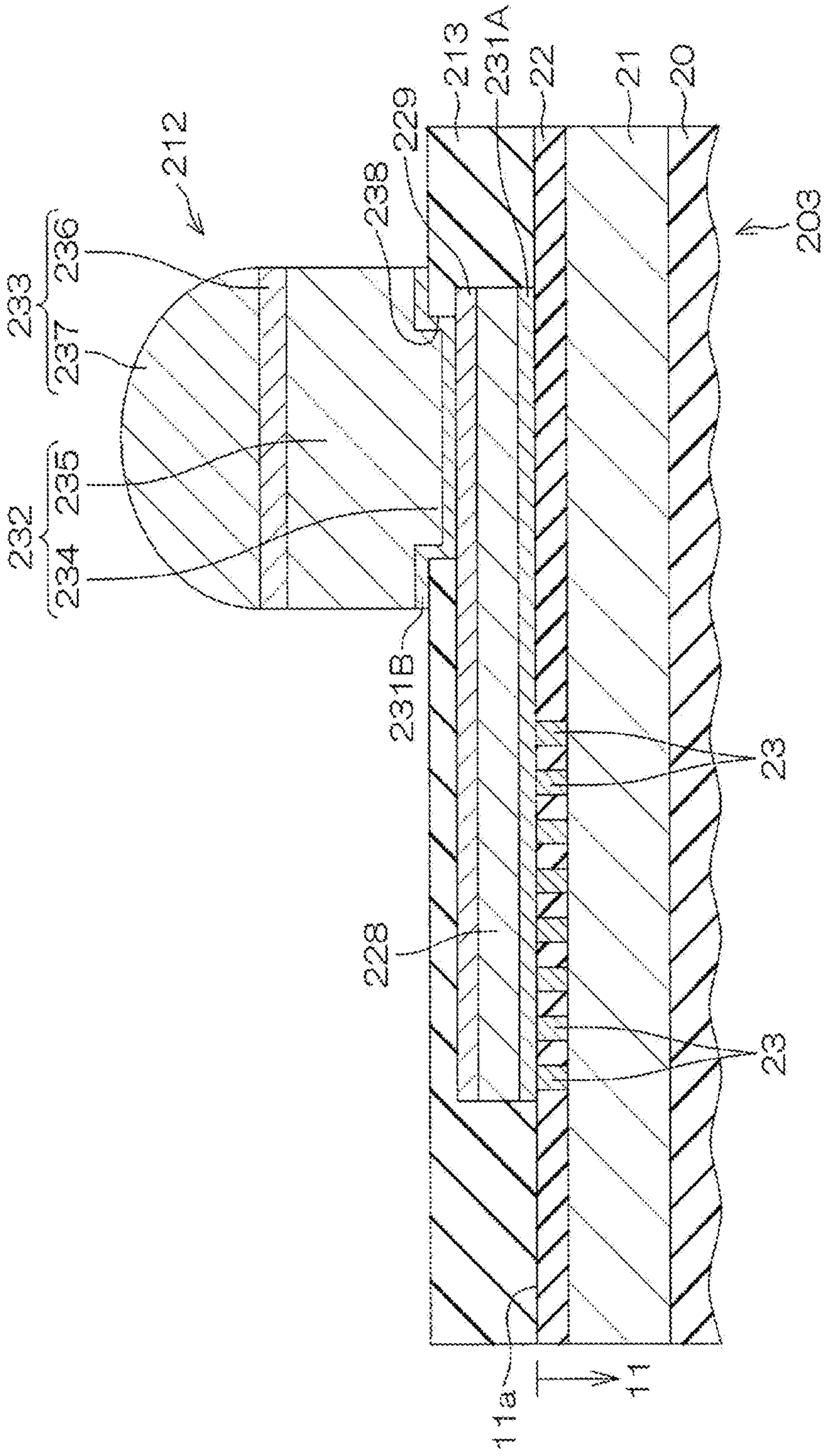
FIG. 7 is an enlarged cross-sectional view, corresponding to FIG. 4, mainly showing a configuration of an electrode terminal of the semiconductor device according to the comparative example.

FIG. 6 is a schematic cross-sectional view, corresponding to FIG. 3, showing a semiconductor package 201 including a semiconductor device 203 according to a comparative example. FIG. 7 is an enlarged cross-sectional view, corresponding to FIG. 4, mainly showing a structure of an electrode terminal of the semiconductor device 203 according to the comparative example.

In FIG. 6, each part corresponding to the above-described FIG. 3 is denoted by the same reference numeral as in FIG. 3. In FIG. 7, each part corresponding to the above-described FIG. 4 is denoted by the same reference numeral as in FIG. 3.

In the following description, the upper side in FIG. 7 (the lower side in FIG. 6) is referred to as "top," and the lower side in FIG. 7 (the upper side in FIG. 6) is referred to as "bottom."

A semiconductor device main body 11 includes a wiring layer 21 formed over an interlayer insulating film 20, an insulating layer 22 formed over the interlayer insulating film 20 so as to cover the wiring layer 21, and a plurality of vias 23 that penetrate the insulating layer 22 and whose one ends are electrically connected to the wiring layer 21. A surface (top surface) of the insulating layer 22 on an opposite side of the insulating layer 22 from the wiring layer 21 constitutes a main surface 11*a* of the semiconductor device main body 11.

An electrode terminal 212 includes a first seed layer 231A that is formed over a surface (top surface) of the insulating layer 22 on an opposite of the insulating layer 22 from the wiring layer 21 and to which the other ends of the plurality of vias 23 are electrically connected.

The electrode terminal 212 further includes a Cu electrode layer 228 formed over a surface (top surface) of the first seed layer 231A on an opposite side of the first seed layer 231A from the insulating layer 22, and a pad electrode layer 229 formed over a surface (top surface) of the Cu electrode layer 228 on an opposite side of the Cu electrode layer 228 from the first seed layer 231A.

The electrode terminal 212 further includes a second seed layer 231B including a portion formed over a surface (top surface) of the pad electrode layer 229 on an opposite side of the pad electrode layer 229 from the Cu electrode layer 228, a Cu columnar body 232 formed over a surface (top surface) of the second seed layer 231B on an opposite side of the second seed layer 231B from the pad electrode layer 229, and a bonding layer 233 formed over a surface (top surface) of the Cu columnar body 232 on an opposite side of the Cu columnar body 232 from the second seed layer 231B.

The first seed layer 231A is electrically connected to the wiring layer 21 via the plurality of vias 23. The Cu electrode layer 228 is electrically connected to the first seed layer 231A. The pad electrode layer 229 is electrically connected to the Cu electrode layer 228.

The second seed layer 231B is electrically connected to the pad electrode layer 229. The Cu columnar body 232 is electrically connected to the second seed layer 231B. The bonding layer 233 is electrically connected to the Cu columnar body 232.

The Cu electrode layer 228 and the Cu columnar body 232 are made of Cu. The pad electrode layer 229 includes a laminated film of a Ni layer formed on the top surface of the Cu electrode layer 228 and a Pd layer formed on the Ni layer.

A surface protection film 213 covers an exposed surface of the insulating layer 22, side surfaces of the Cu electrode layer 228 and the pad electrode layer 229, and most of the top surface of the pad electrode layer 229. An opening 238 having a circular shape in a plan view is formed at the surface protection film 213 to expose a portion of the top surface of the pad electrode layer 229.

The second seed layer 231B covers a side surface and a bottom surface (an exposed surface of the pad electrode layer 229) of the opening 238 and a peripheral edge portion of the opening 238 on a top surface of the surface protection film 213.

The Cu columnar body 232 enters the opening 238 and includes a disc-shaped first portion 234 whose side and bottom surfaces are covered by the second seed layer 231B, and a columnar second portion 235 disposed over the first portion 234. A diameter of the first portion 234 is smaller than a diameter of the second portion 235. A top surface of the first portion 234 is integrally bonded to a central portion of a bottom surface of the second portion 235.

The bonding layer 233 includes a barrier layer 236 formed on a top surface of the second portion 235 of the Cu columnar body 232 and a solder layer 237 formed on a surface (top surface) of the barrier layer 236 on an opposite side of the barrier layer 236 from the Cu columnar body 232. The barrier layer 236 includes a Ni layer. The solder layer 237 includes a SnAg layer. As shown in FIG. 7, before the electrode terminal 212 is bonded to a lead 2, a surface of the solder layer 237 is formed in a hemispherical shape.

When the electrode terminal 212 is bonded to the lead 2, a tip of the solder layer 237 is bonded to the lead 2 in a molten state. Therefore, when the electrode terminal 212 is connected to the lead 2, the tip of the solder layer 237 is formed into a flat surface, as shown in FIG. 6. After the electrode terminal 212 is bonded to the lead 2, sealing with a sealing resin 4 is performed. In a state where the sealing with the sealing resin 4 is performed, a gap between the surface protection film 213 and the lead 2 is filled with the sealing resin 4, as shown in FIG. 6.

FIGS. 8A to 8G are cross-sectional views, corresponding to a cut plane of FIG. 7, showing an example of a process of forming the electrode terminal 212 of the semiconductor device 203 according to the comparative example.

Figure 8A:
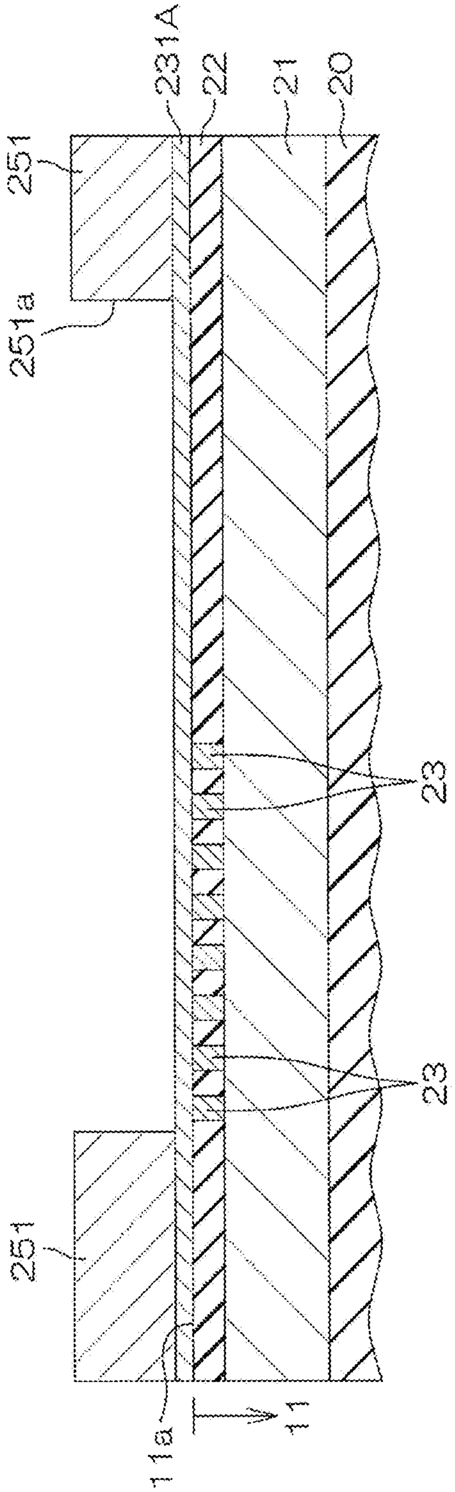
FIG. 8A is a cross-sectional view, corresponding to a cut plane of FIG. 7, showing a part of a process of forming the electrode terminal shown in FIG. 7.

As shown in FIG. 8A, first, the first seed layer 231A is formed over the top surface of the insulating layer 22. Thereafter, a resist mask 251 including an opening 251*a* in a region where the Cu electrode layer 228 is to be formed is formed on the first seed layer 231A by photolithography.

Figure 8B:
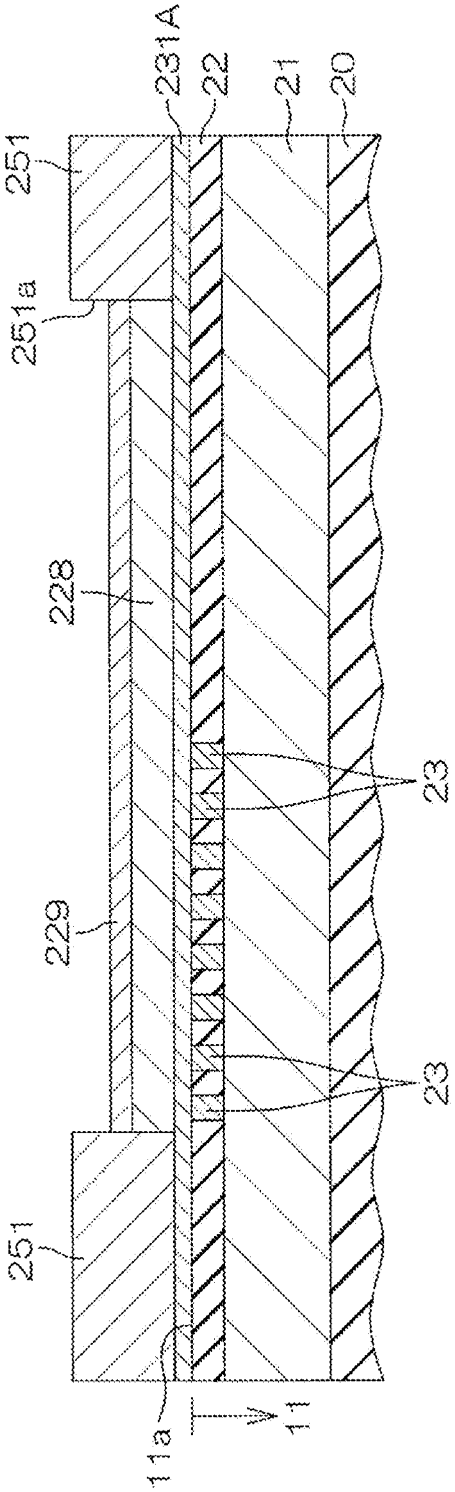
FIG. 8B is a cross-sectional view showing a next step of FIG. 8A.

Next, as shown in FIG. 8B, the Cu electrode layer 228 and the pad electrode layer 229 are sequentially formed over the first seed layer 231A by a plating method.

Figure 8C:
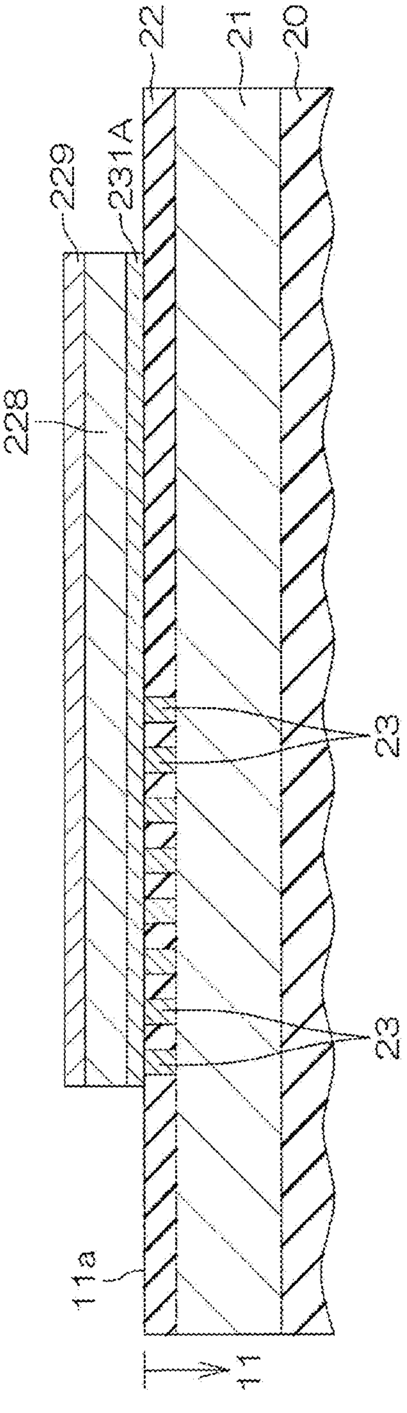
FIG. 8C is a cross-sectional view showing a next step of FIG. 8B.

Next, as shown in FIG. 8C, the resist mask 251 is removed. Then, unnecessary portions of the first seed layer 231A are removed by etching so that only the first seed layer 231A below the Cu electrode layer 228 remains.

Figure 8D:
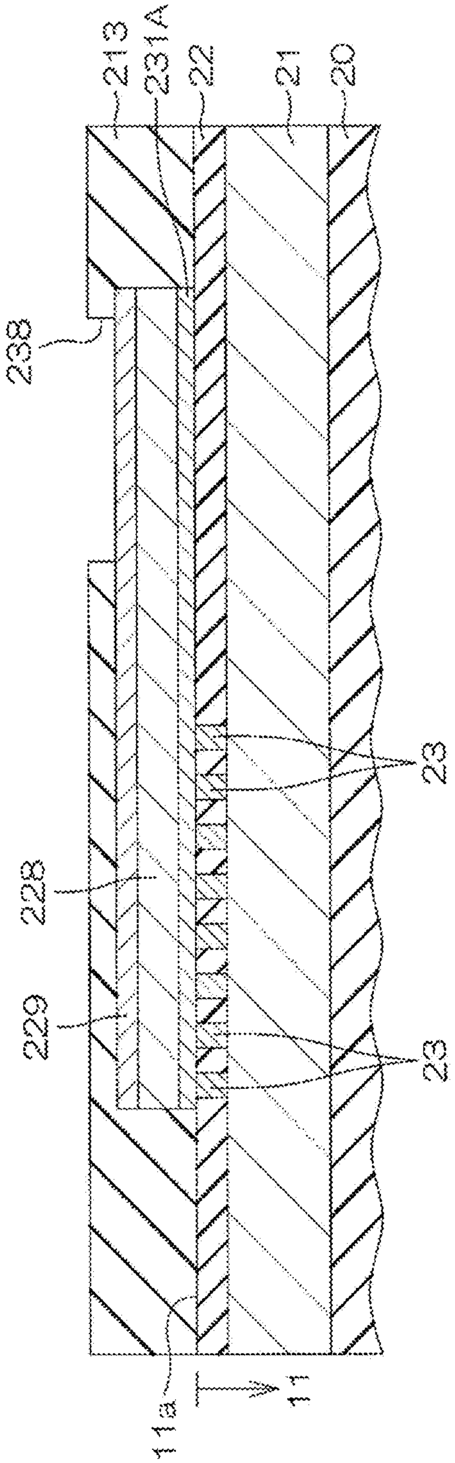
FIG. 8D is a cross-sectional view showing a next step of FIG. 8C.

Next, as shown in FIG. 8D, the surface protection film 213 made of photosensitive resin is formed over the insulating layer 22 so as to cover an exposed surface of the insulating layer 22, a side surface of the Cu electrode layer 228, and the side and top surfaces of the pad electrode layer 229. The surface protection film 213 is then patterned by exposing, developing, and curing the surface protection film 213. As a result, the opening 238 that exposes a portion of the top surface of the pad electrode layer 229 is formed.

Figure 8E:
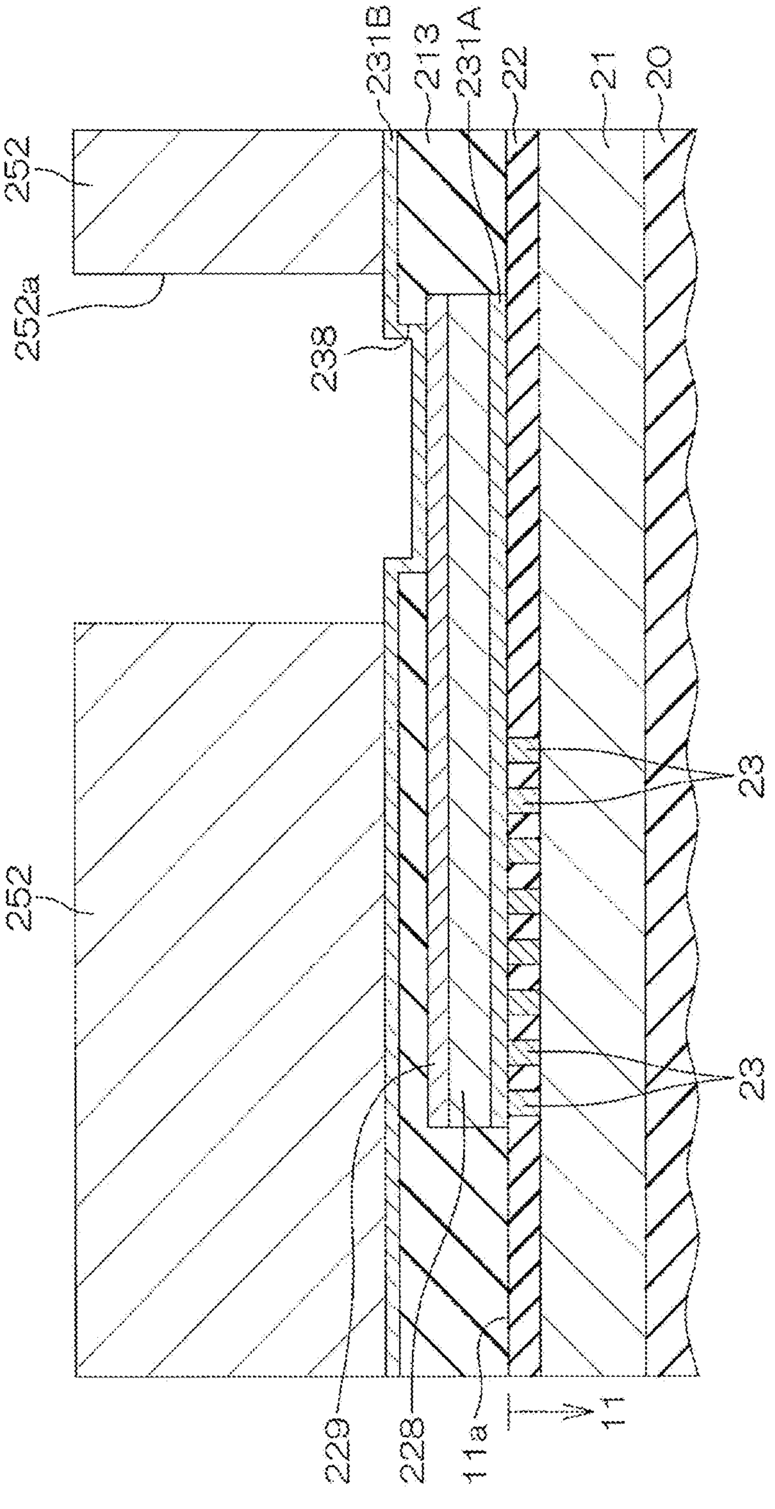
FIG. 8E is a cross-sectional view showing a next step of FIG. 8D.

Next, as shown in FIG. 8E, the second seed layer 231B is formed on the top surface of the surface protection film 213. Thereafter, a resist mask 252 including an opening 252*a* in a region where the Cu columnar body 232 is to be formed is formed on the top surface of the second seed layer 231B by photolithography.

Figure 8F:
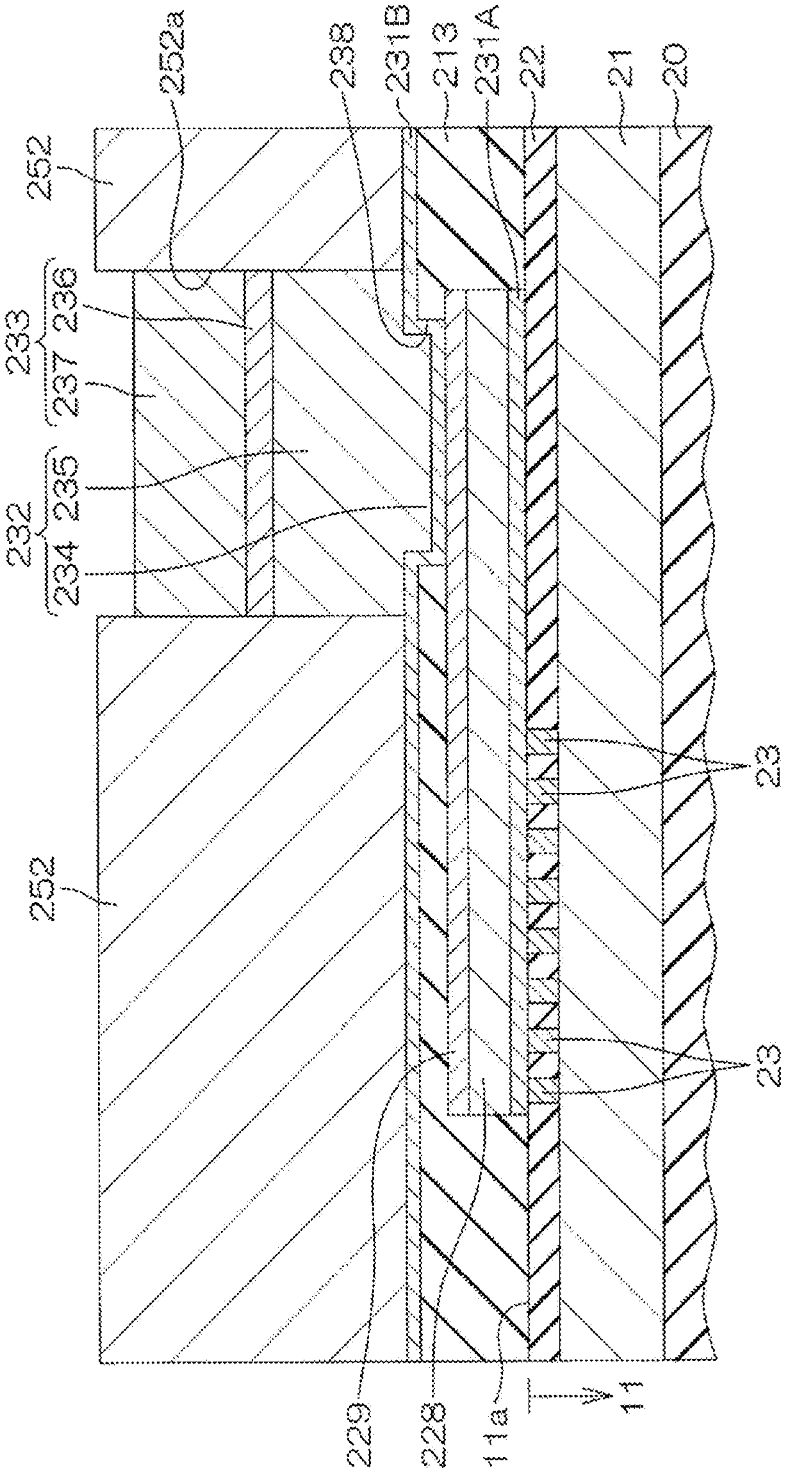
FIG. 8F is a cross-sectional view showing a next step of FIG. 8E.

Next, as shown in FIG. 8F, the first portion 234, the second portion 235, the barrier layer 236, and the solder layer 237 are sequentially formed over the second seed layer 231B by a plating method. As a result, the Cu columnar body 232 including the first portion 234 and the second portion 235 is formed over the second seed layer 231B. Further, the bonding layer 233 including the barrier layer 236 and the solder layer 237 is formed over the Cu columnar body 232.

Figure 8G:
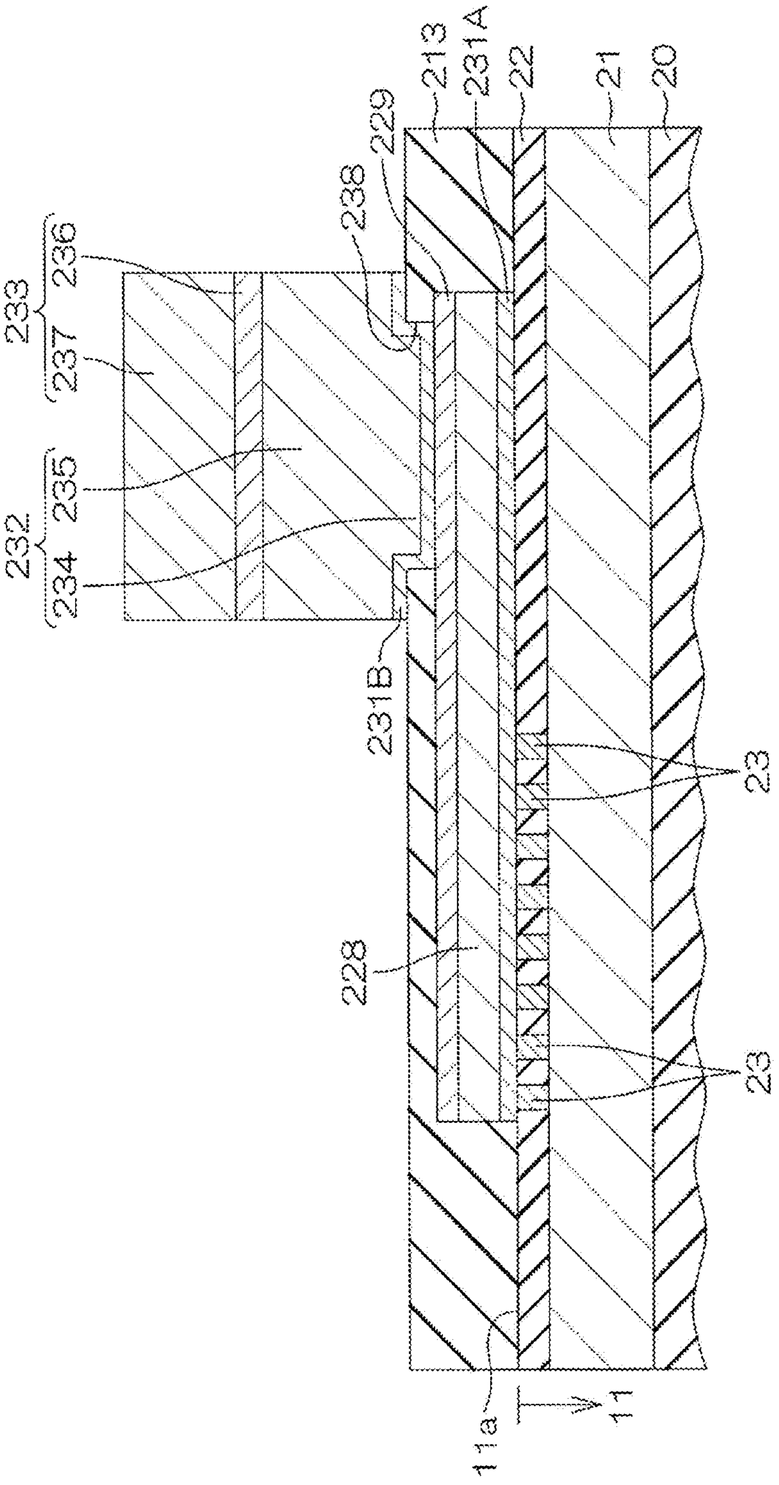
FIG. 8G is a cross-sectional view showing a next step of FIG. 8F.

Next, as shown in FIG. 8G, the resist mask 252 is removed. Then, unnecessary portions of the second seed layer 231B are removed by etching so that only the second seed layer 231B below the Cu columnar body 232 remains.

Figure 8H:
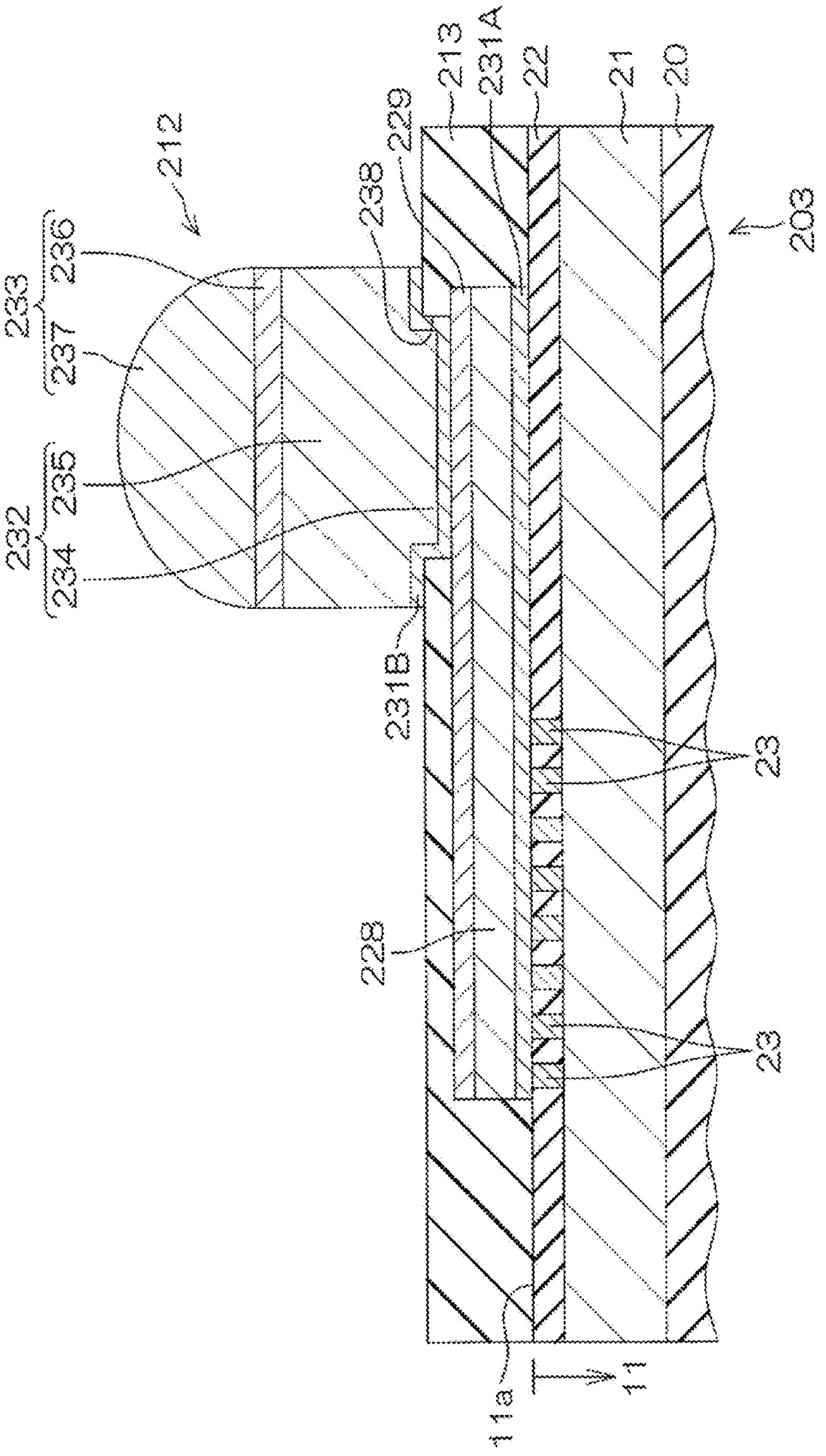
FIG. 8H is a cross-sectional view showing a next step of FIG. 8G.

Next, as shown in FIG. 8H, the surface of the solder layer 237 is formed in a hemispherical shape by reflow. As a result, the electrode terminal 212 shown in FIG. 7 is obtained.

The electrode terminal 212 of the semiconductor device 203 according to the comparative example includes the first seed layer 231A, the Cu electrode layer 228, the pad electrode layer 229, the second seed layer 231B, the Cu columnar body 232, and the bonding layer 233. In contrast, the electrode terminal 12 of the semiconductor device 3 according to the first embodiment includes the seed layer 31, the pillar layer 32, and the bonding layer 33.

The electrode terminal 12 of the semiconductor device 3 according to the first embodiment is different from that of the comparative example in that the electrode terminal 12 does not include the Cu electrode layer 228, the pad electrode layer 229, and the second seed layer 231B of the electrode terminal 212 of the comparative example. As a result, the semiconductor device 3 according to the first embodiment is easier to manufacture than the semiconductor device 203 of the comparative example.

The Cu columnar body 232 in the comparative example includes the disc-shaped first portion 234 formed on the top surface of the second seed layer 231B and the columnar second portion 235 formed on the top surface of the first portion 234. The pillar layer 32 in the first embodiment includes the disc-shaped first portion 34 formed on the seed layer 31 and the columnar second portion 35 formed on the first portion 34.

In the Cu columnar body 232 of the comparative example, the diameter of the first portion 234 is smaller than the diameter of the second portion 235, whereas in the pillar layer 32 of the first embodiment, the diameter of the first portion 34 is larger than the diameter of the second portion 35. In the first embodiment, by making the diameter of the first portion 34 larger than the diameter of the second portion 35, it is made possible to omit the Cu electrode layer 228, the pad electrode layer 229, and the second seed layer 231B of the comparative example.

Figure 9:
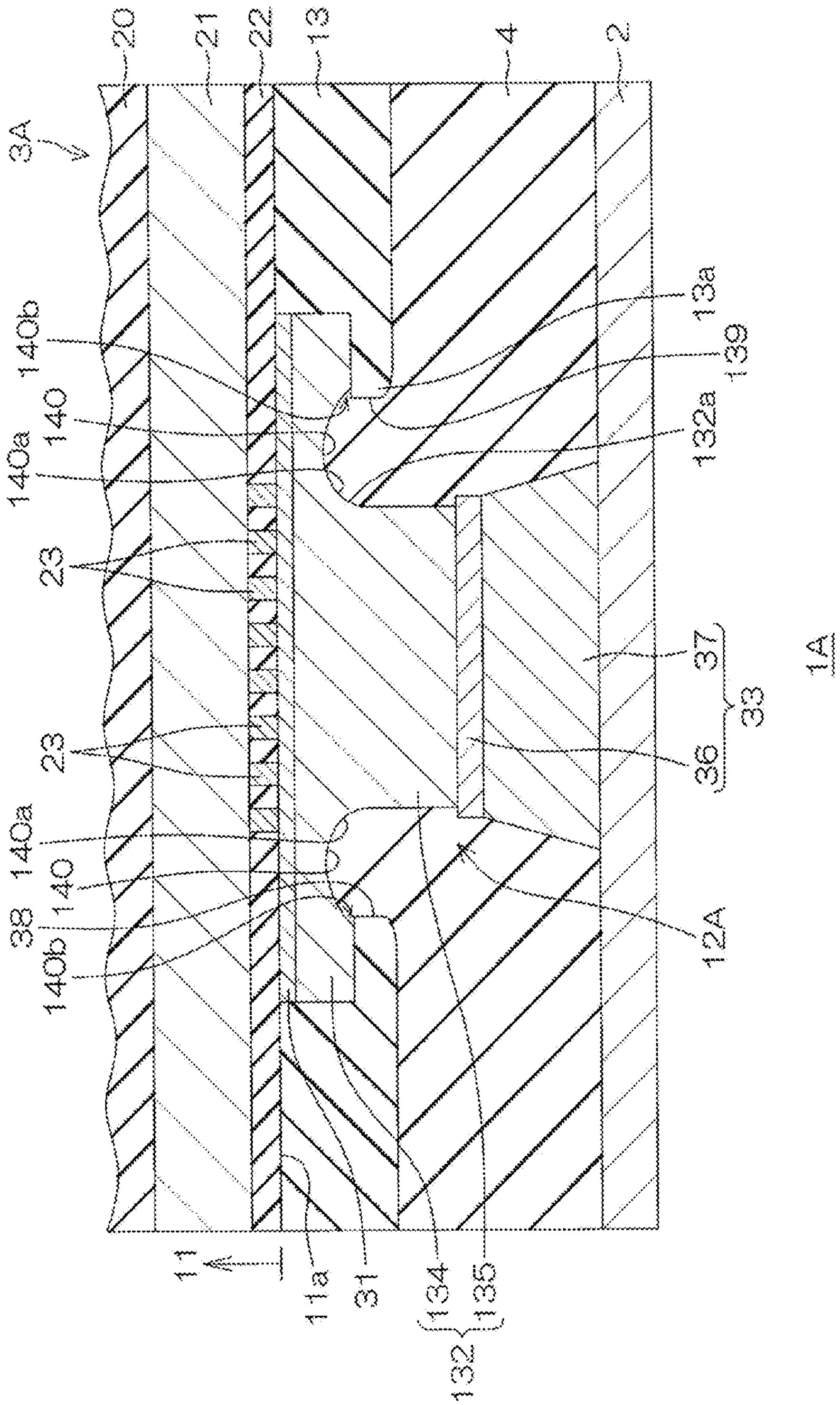
FIG. 9 is a schematic cross-sectional view, corresponding to FIG. 3, showing a semiconductor package containing a semiconductor device according to a second embodiment of the present disclosure.
Figure 10:
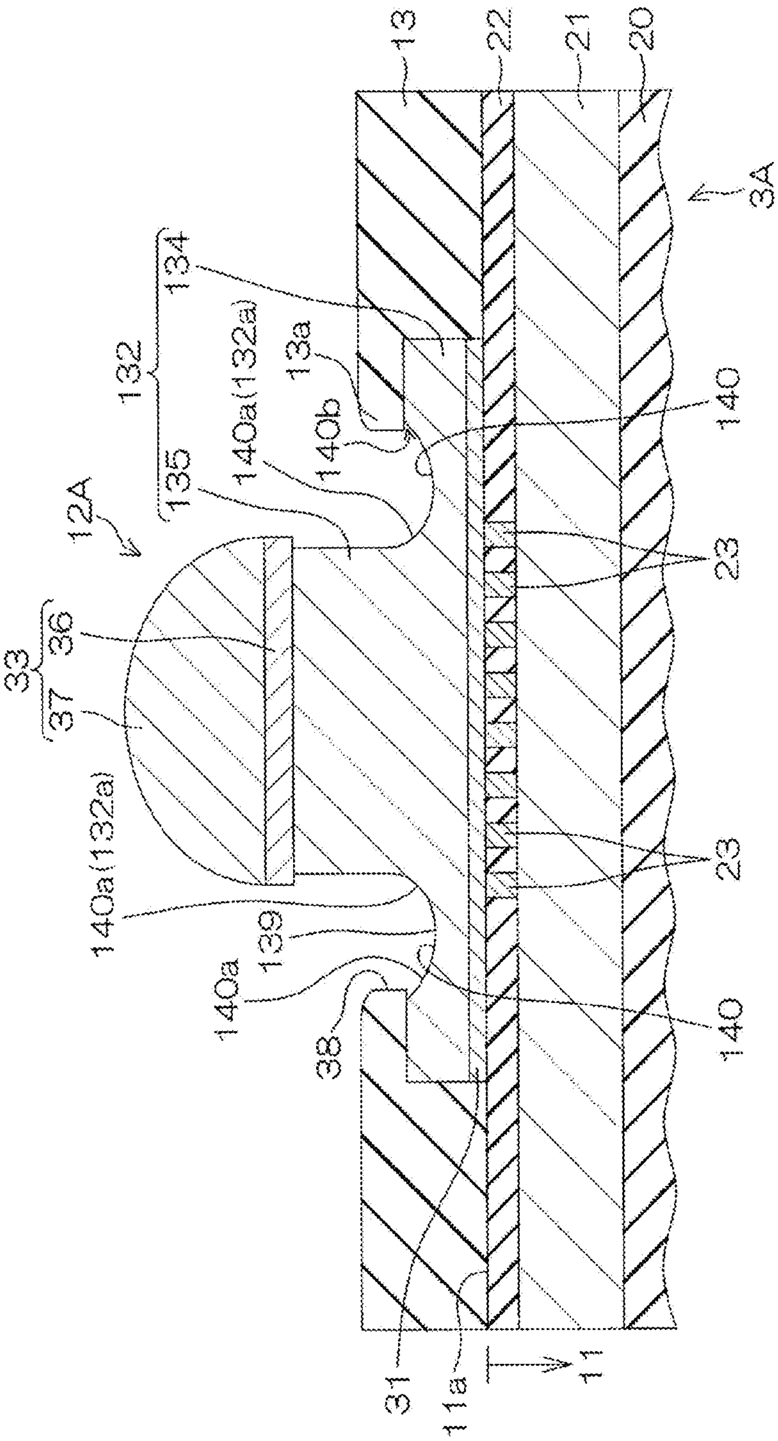
FIG. 10 is an enlarged cross-sectional view, corresponding to FIG. 4, mainly showing a configuration of an electrode terminal of the semiconductor device according to the second embodiment of the present disclosure.

FIG. 9 is a schematic cross-sectional view, corresponding to FIG. 3, showing a semiconductor package 1A including a semiconductor device 3A according to a second embodiment. FIG. 10 is an enlarged cross-sectional view, corresponding to FIG. 4, mainly showing a configuration of an electrode terminal 12A of the semiconductor device 3A according to the second embodiment. FIGS. 1 and 2 described above are also common to the semiconductor package 1A including the semiconductor device 3A according to the second embodiment.

In FIG. 9, each part corresponding to the above-described FIG. 3 is denoted by the same reference numeral as in FIG. 3. In FIG. 10, each part corresponding to the above-described FIG. 4 is denoted by the same reference numeral as in FIG. 4.

In the following description, the upper side in FIG. 10 (the lower side in FIG. 9) is referred to as "top," and the lower side in FIG. 10 (the upper side in FIG. 9) is referred to as "bottom."

A semiconductor device main body 11 includes a wiring layer 21 formed over an interlayer insulating film 20, an insulating layer 22 formed over the interlayer insulating film 20 so as to cover the wiring layer 21, and a plurality of vias 23 that penetrate the insulating layer 22 and whose one ends are electrically connected to the wiring layer 21. A surface (top surface) of the insulating layer 22 on an opposite side of the insulating layer 22 from the wiring layer 21 constitutes a main surface 11*a* of the semiconductor device main body 11.

The electrode terminal 12A includes a seed layer 31 formed over the top surface of the insulating layer 22 and to which the other ends of the plurality of vias 23 are electrically connected, a pillar layer 132 formed on a top surface of the seed layer 31, and a bonding layer 33 electrically connected to a top surface of the pillar layer 132.

The seed layer 31 is electrically connected to the wiring layer 21 via the plurality of vias 23. The pillar layer 132 is electrically connected to the seed layer 31. The bonding layer 33 is electrically connected to the pillar layer 132.

The bonding layer 33 includes a barrier layer 36 formed over the top surface of the pillar layer 132 and a solder layer 37 formed over a top surface of the barrier layer 36, as in the first embodiment. As shown in FIG. 10, before the electrode terminal 12A is bonded to a lead 2, a surface of the solder layer 37 is formed in a hemispherical shape.

The pillar layer 132 includes a Cu layer. In the second embodiment, the shape of the pillar layer 132 is different from the shape of the pillar layer 32 of the first embodiment. The other configurations are the same as those of the first embodiment.

The pillar layer 132 includes a disc-shaped first portion 134 formed on the seed layer 31 and a columnar second portion 135 formed over a central portion of a top surface of the first portion 134. In a plan view, a center of the second portion 135 coincides with a center of the first portion 134. A diameter of the first portion 134 is larger than a diameter of the second portion 135. The first portion 134 and the second portion 135 are integrally formed.

Similarly to the first embodiment, in the second embodiment, the center of the second portion 135 and the center of the barrier layer 36 coincide with each other in a plan view. However, in the second embodiment, the diameter of the second portion 135 is smaller than a diameter of the barrier layer 36. As a result, in a plan view, an outer peripheral edge portion of the second portion 135 is retreated inward with respect to an outer peripheral edge portion of the barrier layer 36. In other words, the outer peripheral edge of the barrier layer 36 protrudes further outward than a side surface of the second portion 135.

Further, in the second embodiment, an annular groove 140 surrounding the second portion 135 is formed on the top surface of the first portion 134 at a peripheral edge portion of the second portion 135. The annular groove 140 has an arc-shaped inner surface 140*a* which is convex (downward) toward the seed layer 31 in a horizontal cross-sectional view. Due to this annular groove 140, a connection portion 132*a* between the top surface of the first portion 134 and the side surface of the second portion 135 is formed into a curved surface that is inwardly convex in a vertical cross-sectional view.

The diameter of the first portion 134 is preferably 80 μm or more and 400 μm or less. A thickness of the first portion 134 is preferably 4 μm or more and 15 μm or less.

The diameter of the second portion 135 is preferably 40 μm or more and 300 μm or less. A thickness of the second portion 135 is preferably 35 μm or more and 150 μm or less.

A surface protection film 13 covers an exposed surface of the insulating layer 22, a side surface of the pillar layer 132, and an outer peripheral edge portion of the top surface of the first portion 134 of the pillar layer 132. The peripheral edge portion of the second portion 135 on the top surface of the first portion 134 of the pillar layer 132, the side surface of the second portion 135, and the surface of the bonding layer 33 are not covered by the surface protection film 13.

In other words, the surface protection film 13 is formed with a circle-shaped removed portion (opening) 38 that is concentric with the center of the second portion 135 in a plan view and is larger than an outer peripheral edge of the second portion 135 and smaller than an outer peripheral edge of the first portion 134.

In the second embodiment, the surface protection film 13 has an eaves portion 13*a* extending above the annular groove 140 at a side of the removed portion 38. A gap 140*b*, which is wedge-shaped in a vertical cross-sectional view, is formed between the eaves portion 13*a* and an outer peripheral edge portion of an inner surface of the annular groove 140.

A side surface (inner peripheral surface) of the removed portion 38, the side surface of the second portion 135, and the annular groove 140 form an annular recess 139 in a plan view. In this embodiment, the surface protection film 13 is made of photosensitive resin, such as polyimide.

When the electrode terminal 12A is bonded to the lead 2, a tip of the solder layer 37 is bonded to the lead 2 in a molten state. Therefore, when the electrode terminal 12A is bonded to the lead 2, the tip of the solder layer 37 is formed into a flat surface, as shown in FIG. 9. After the electrode terminal 12A is bonded to the lead 2, sealing with the sealing resin 4 is performed. In a state where the sealing with the sealing resin 4 is performed, a gap between the surface protection film 13 and the lead 2 and a space inside the annular recess 39 including the annular groove 140 are filled with the sealing resin 4, as shown in FIG. 9. As a result, the gap 140*b* is also filled with the sealing resin 4.

In the above-described first embodiment, the pillar layer 32 has the corner portion 32*a* where the top surface of the first portion 34 and the side surface of the second portion 35 intersect at a substantially right angle. When the electrode terminal 12 is bonded to the lead 2, the recess 39 with the corner portion 32*a* as a portion of its inner surface is filled with the sealing resin 4, as shown in FIG. 3. Cu, which is the material of the pillar layer 32, and resin, which is the material of the sealing resin 4, have significantly different coefficients of thermal expansion. Therefore, a stress is concentrated on a corner portion of the sealing resin 4 in the recess 39 corresponding to the corner portion 32*a*, and there is a possibility that cracks may occur in the sealing resin 4.

In contrast, in the second embodiment, the connection portion 132*a* between the top surface of the first portion 134 of the pillar layer 132 and the side surface of the second portion 135 is formed into a curved surface in a vertical cross-sectional view. Therefore, in the state where the electrode terminal 12A is bonded to the lead 2 (the state shown in FIG. 9), stress concentration on a portion of the sealing resin 4 in the recess 139 corresponding to the connection portion 132*a* may be alleviated, and the occurrence of cracks in the sealing resin 4 may be suppressed.

A method of forming the electrode terminal 12 in the second embodiment will be described. When forming the electrode terminal 12 in the second embodiment, the same steps as in FIGS. 5A to 5H described above are performed. However, in FIGS. 5A to 5H, reference numerals 12, 32, 34, 35, and 39 are replaced with reference numerals 12A, 132, 134, 135, and 139, respectively.

After the step of FIG. 5H, an exposed surface of the pillar layer 132 is etched by wet etching. As a result, as shown in FIG. 10, the annular groove 140 is formed on the top surface of the first portion 134 at the peripheral edge portion of the second portion 135, and the recess 139 including the annular groove 140 is formed.

Figure 11:
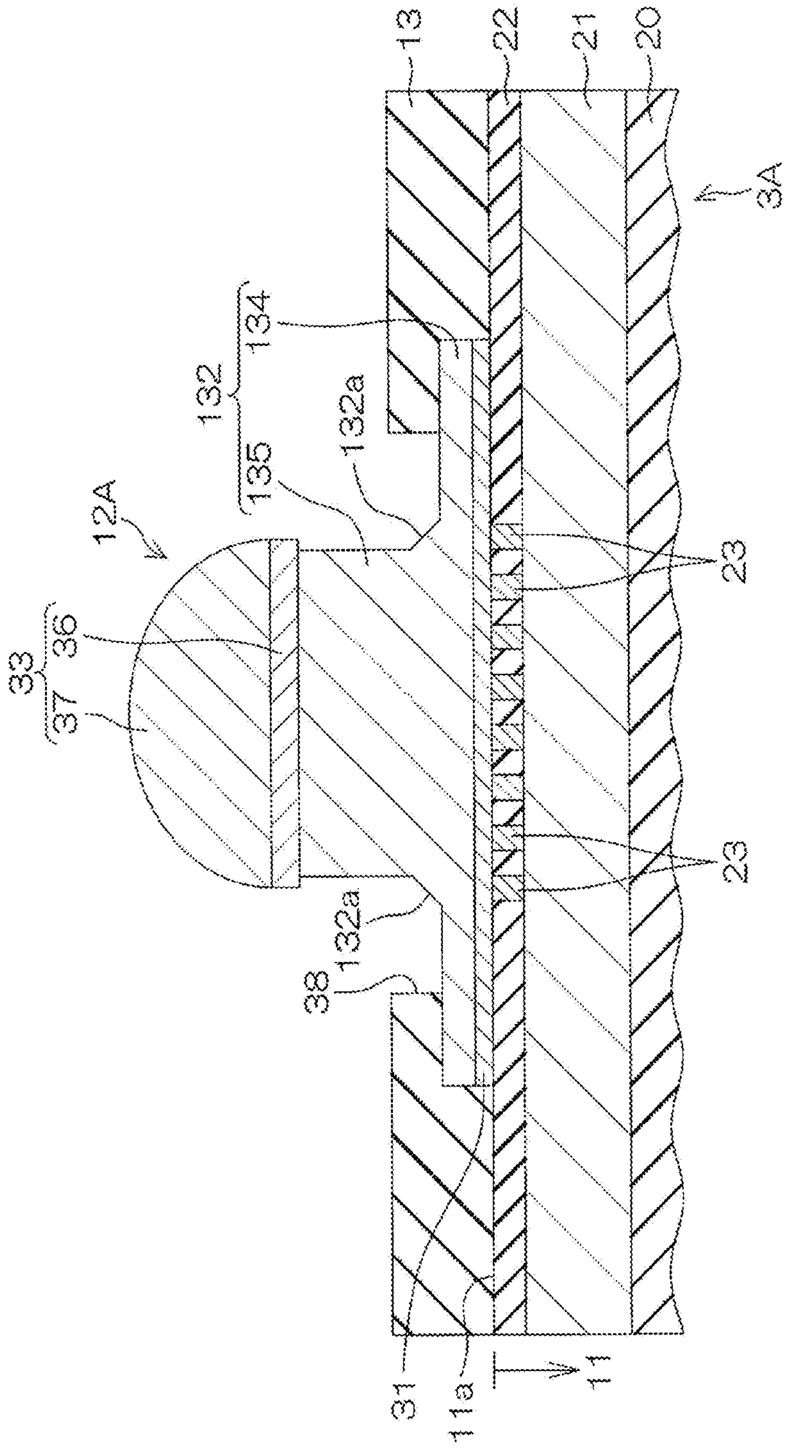
FIG. 11 is an enlarged cross-sectional view, corresponding to FIG. 10, showing a modification of the electrode terminal according to the second embodiment of the present disclosure.

Further, as shown in FIG. 11, the connection portion 132*a* between the top surface of the first portion 134 and the side surface of the second portion 135 is an inclined surface such that a horizontal cross-section of the connection portion 132*a* gradually increases downward, and may also be formed on an inclined surface that is inclined with respect to the top surface of the first portion 134.

Although the first and second embodiments of the present disclosure have been described above, the present disclosure can also be implemented in other forms.

For example, in the above-described first and second embodiments, the bonding layer 33 includes the barrier layer formed over the pillar layer 32 and the solder layer 37 formed over the barrier layer 36. However, the bonding layer 33 may not include the barrier layer 36. That is, the bonding layer 33 may be composed of only the solder layer 37 formed over the pillar layer 32.

Further, the barrier layer 36 and the solder layer 37 may each be made of materials other than the above-mentioned materials.

Although the embodiments of the present disclosure have been described in detail, these are only specific examples used to clarify the technical contents of the present disclosure, and the present disclosure should not be construed as limited to these specific examples, but the scope of the present disclosure is limited only by the appended claims.

The features described below can be extracted from the description of the present disclosure and the drawings.

Supplementary Note 1-1

A semiconductor device including:

a semiconductor device main body (11); and an electrode terminal (12, 12A) provided at a side of a main surface (11*a*) of the semiconductor device main body (11) and partially protruding outward from the main surface (11*a*), wherein the electrode terminal includes:

a pillar layer (32, 132) made of copper and electrically connected to a wiring layer (21) disposed within the semiconductor device main body (11); and a bonding layer (33) formed over a surface of the pillar layer (32, 132) on an opposite side of the pillar layer (32, 132) from the wiring layer (21), and wherein the pillar layer (32, 132) includes:

a disc-shaped first portion (34, 134); and a columnar second portion (35, 135) formed over a central portion of a surface of the first portion (34, 134) on an opposite side of the first portion (34, 134) from the wiring layer (21).

Supplementary Note 1-2

The semiconductor device of Supplementary Note 1-1, wherein a connection portion (132*a*) between the surface of the first portion (34, 134) and a side surface of the second portion (35, 135) is formed into a curved surface that is inwardly convex in a vertical cross-sectional view.

Supplementary Note 1-3

The semiconductor device of Supplementary Note 1-1, wherein an annular groove (140) that surrounds the second portion (35, 135) and has an arc-shaped inner surface (140*a*) which is convex toward the wiring layer (21) in a horizontal cross-sectional view is formed over the surface of the first portion (34, 134) at a peripheral edge portion of the second portion (35, 135), and wherein a connection portion (132*a*) between the surface of the first portion (34, 134) and a side surface of the second portion (35, 135) is formed into a curved surface that is inwardly convex in a vertical cross-sectional view.

Supplementary Note 1-4

The semiconductor device of Supplementary Note 1-1, wherein a connection portion (132*a*) between the front surface of the first portion (34, 134) and a side surface of the second portion (35, 135) is formed into an inclined surface that is inclined with respect to the surface of the first portion (34, 134) in a vertical cross-sectional view.

Supplementary Note 1-5

The semiconductor device of any one of Supplementary Notes 1-1 to 1-4, wherein the bonding layer (33) includes a solder layer (37).

Supplementary Note 1-6

The semiconductor device of Supplementary Note 1-5, wherein the solder layer (37) includes a SnAg layer.

Supplementary Note 1-7

The semiconductor device of any one of Supplementary Notes 1-1 to 1-4, wherein the bonding layer (33) includes a barrier layer (36) bonded to the pillar layer (32, 132) and a solder layer (37) bonded to an outer surface of the barrier layer (36).

Supplementary Note 1-8

The semiconductor device of Supplementary Note 1-7, wherein the barrier layer (36) includes a Ni layer, and wherein the solder layer (37) includes a SnAg layer.

Supplementary Note 1-9

The semiconductor device of any one of Supplementary Notes 1-1 to 1-8, wherein a thickness of the first portion (34, 134) is 4 μm or more and 15 μm or less, and wherein a thickness of the second portion (35, 135) is 35 μm or more and 150 μm or less.

Supplementary Note 1-10

The semiconductor device of Supplementary Note 1-9, wherein a diameter of the first portion (34, 134) is 80 μm or more and 400 μm or less, and wherein a diameter of the second portion (35, 135) is 40 μm or more and 300 μm or less.

Supplementary Note 1-11

The semiconductor device of any one of Supplementary Notes 1-1 to 1-10, wherein the semiconductor device main body (11) includes:

an insulating layer (22) formed over the wiring layer (21); and a plurality of vias (23) that penetrate the insulating layer (22) and whose one ends are electrically connected to the wiring layer (21), wherein the electrode terminal (12, 12A) includes a seed layer (31) formed over a surface of the insulating layer (22) on an opposite side of the insulating layer (22) from the wiring layer (21) and to which the other end of each of the vias (23) is electrically connected, and wherein the pillar layer (32, 132) is formed over the seed layer (31).

Supplementary Note 1-12

The semiconductor device of Supplementary Note 1-11, further including: a surface protection film (13) that covers an exposed surface of the insulating layer (22), a side surface of the first portion (34, 134), and an outer peripheral edge portion of the surface of the first portion (34, 134).

Supplementary Note 1-13

The semiconductor device of Supplementary Note 1-12, wherein the surface protection film (13) is formed with a circle-shaped removed portion (38) that is concentric with a center of the second portion (35, 135) and is larger than an outer peripheral edge of the second portion (35, 135) and smaller than an outer peripheral edge of the first portion (34, 134), in a plan view, and wherein an annular recess (39, 139) is formed by a side surface of the removed portion (38), a side surface of the second portion (35, 135), and a portion between the side surface of the removed portion (38) and the side surface of the second portion (35, 135) at the surface of the first portion (34, 134) in the plan view.

Supplementary Note 1-14

A semiconductor package (1, 1A) including the semiconductor device of Supplementary Note 1-13, including:

a lead (2) bonded to the bonding layer (33) of the electrode terminal (12, 12A); and a sealing resin (4) that seals the semiconductor device (3, 3A) and a portion of the lead (2), wherein a gap between the lead (2) and the surface protection film (13) and a space inside the recess (39, 139) are filled with the sealing resin (4).

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:

a semiconductor device main body; and an electrode terminal provided at a side of a main surface of the semiconductor device main body and partially protruding outward from the main surface, wherein the semiconductor device main body includes:

an insulating layer formed over a wiring layer that is disposed within the semiconductor device main body; and a plurality of vias that penetrate the insulating layer and whose one ends are electrically connected to the wiring layer, wherein the electrode terminal includes:

a pillar layer made of copper and electrically connected to the wiring layer;

a bonding layer formed over a surface of the pillar layer on an opposite side of the pillar layer from the wiring layer; and a seed layer formed over a surface of the insulating layer on an opposite side of the insulating layer from the wiring layer and to which the other end of each of the vias is electrically connected, wherein the pillar layer includes:

a disc-shaped first portion; and a columnar second portion formed over a central portion of a surface of the first portion on an opposite side of the first portion from the wiring layer, and wherein the pillar layer is formed over the seed layer.

2. The semiconductor device of claim 1, wherein a connection portion between the surface of the first portion and a side surface of the second portion is formed into a curved surface that is inwardly convex in a vertical cross-sectional view.

3. The semiconductor device of claim 1, wherein an annular groove that surrounds the second portion and has an arc-shaped inner surface which is convex toward the wiring layer in a horizontal cross-sectional view is formed over the surface of the first portion at a peripheral edge portion of the second portion, and wherein a connection portion between the surface of the first portion and a side surface of the second portion is formed into a curved surface that is inwardly convex in a vertical cross-sectional view.

4. The semiconductor device of claim 1, wherein a connection portion between the surface of the first portion and a side surface of the second portion is formed into an inclined surface that is inclined with respect to the surface of the first portion in a vertical cross-sectional view.

5. The semiconductor device of claim 1, wherein the bonding layer includes a solder layer.

6. The semiconductor device of claim 5, wherein the solder layer includes a SnAg layer.

7. The semiconductor device of claim 1, wherein the bonding layer includes a barrier layer bonded to the pillar layer and a solder layer bonded to an outer surface of the barrier layer.

8. The semiconductor device of claim 7, wherein the barrier layer includes a Ni layer, and wherein the solder layer includes a SnAg layer.

9. The semiconductor device of claim 1, wherein a thickness of the first portion is 4 μm or more and 15 μm or less, and wherein a thickness of the second portion is 35 μm or more and 150 μm or less.

10. The semiconductor device of claim 9, wherein a diameter of the first portion is 80 μm or more and 400 μm or less, and wherein a diameter of the second portion is 40 μm or more and 300 μm or less.

11. The semiconductor device of claim 1, further comprising: a surface protection film that covers an exposed surface of the insulating layer, a side surface of the first portion, and an outer peripheral edge portion of the surface of the first portion.

12. The semiconductor device of claim 11, wherein the surface protection film is formed with a circle-shaped removed portion that is concentric with a center of the second portion and is larger than an outer peripheral edge of the second portion and smaller than an outer peripheral edge of the first portion, in a plan view, and wherein an annular recess is formed by a side surface of the removed portion, a side surface of the second portion, and a portion between the side surface of the removed portion and the side surface of the second portion at the surface of the first portion in the plan view.

13. A semiconductor package including the semiconductor device of claim 12, comprising:

a lead bonded to the bonding layer of the electrode terminal; and a sealing resin that seals the semiconductor device and a portion of the lead, wherein a gap between the lead and the surface protection film and a space inside the recess are filled with the sealing resin.

* * * * *